(12) United States Patent
Kelly et al.

(10) Patent No.: US 10,763,114 B2
(45) Date of Patent: Sep. 1, 2020

(54) METHOD OF FABRICATING GATE OXIDE OF SEMICONDUCTOR DEVICE

(71) Applicant: TAIWAN SEMICONDUCTOR MANUFACTURING CO., LTD., Hsinchu (TW)

(72) Inventors: Andrew Joseph Kelly, Hsinchu County (TW); Yusuke Oniki, Hsinchu (TW); Yasutoshi Okuno, Hsinchu (TW); Ta-Chun Ma, New Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/719,245

(22) Filed: Sep. 28, 2017

(65) Prior Publication Data

US 2019/0096682 A1   Mar. 28, 2019

(51) Int. Cl.
| | |
|---|---|
| *H01L 21/28* | (2006.01) |
| *H01L 27/088* | (2006.01) |
| *H01L 29/51* | (2006.01) |
| *H01L 29/66* | (2006.01) |
| *H01L 21/02* | (2006.01) |
| *H01L 21/8234* | (2006.01) |
| *H01L 29/78* | (2006.01) |
| *H01L 21/311* | (2006.01) |

(52) U.S. Cl.
CPC .... *H01L 21/28229* (2013.01); *H01L 21/0206* (2013.01); *H01L 21/31111* (2013.01); *H01L 21/823431* (2013.01); *H01L 27/0886* (2013.01); *H01L 29/513* (2013.01); *H01L 29/66795* (2013.01); *H01L 29/785* (2013.01); *H01L 21/02332* (2013.01)

(58) Field of Classification Search
CPC ............. H01L 21/28202; H01L 29/513; H01L 21/823431; H01L 29/785; H01L 29/66795; H01L 21/02332; H01L 29/7813; H01L 29/66734; H01L 29/4236
See application file for complete search history.

(56) References Cited

U.S. PATENT DOCUMENTS

| | | | |
|---|---|---|---|
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |

(Continued)

*Primary Examiner* — Samuel A Gebremariam
*Assistant Examiner* — Jonas T Beardsley
(74) *Attorney, Agent, or Firm* — Maschoff Brennan

(57) ABSTRACT

A method of fabricating a semiconductor device includes forming a semiconductor fin comprising a channel region for a fin field effect transistor (finFET). A gate oxide layer is then formed on the channel. The gate oxide layer is treated with a nitrogen containing agent so as to form a nitrogenous layer and an interfacial layer. The nitrogenous layer is then removed. A high-k dielectric layer is formed on the interfacial layer. A metal gate is formed on the high-k dielectric layer. The nitrogenous layer is removed by rinsing the semiconductor fin with deionized water. The gate oxide and interfacial layer contains the same material.

20 Claims, 40 Drawing Sheets

(56) References Cited

U.S. PATENT DOCUMENTS

| | | |
|---|---|---|
| 9,548,303 B2 | 1/2017 | Lee et al. |
| 9,576,814 B2 | 2/2017 | Wu et al. |
| 2006/0060562 A1* | 3/2006 | Furukawa ........... H01L 21/0337 216/41 |
| 2012/0220116 A1* | 8/2012 | Noori ................ H01L 21/02301 438/591 |
| 2016/0133459 A1* | 5/2016 | Ko .................... H01L 29/66795 438/759 |
| 2016/0336428 A1* | 11/2016 | Cheng ............... H01L 29/66795 |
| 2017/0294519 A1* | 10/2017 | Khan ................ H01L 29/42364 |
| 2019/0081169 A1* | 3/2019 | Zhou ............... H01L 21/823431 |

* cited by examiner

US 10,763,114 B2

METHOD OF FABRICATING GATE OXIDE OF SEMICONDUCTOR DEVICE

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. When using high-k dielectric material in the gate structure, the high-k dielectric material cannot be easily formed on the semiconductor substrate. An interfacial layer between the high-k dielectric layer and the semiconductor substrate allows better capacitance contribution, integrity and quality of the high-k dielectrics. However, the interfacial layer is often a thick oxide layer on the channel region of the FETs. The resulting gate stack has a thickness that renders the device dimension overly sized.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
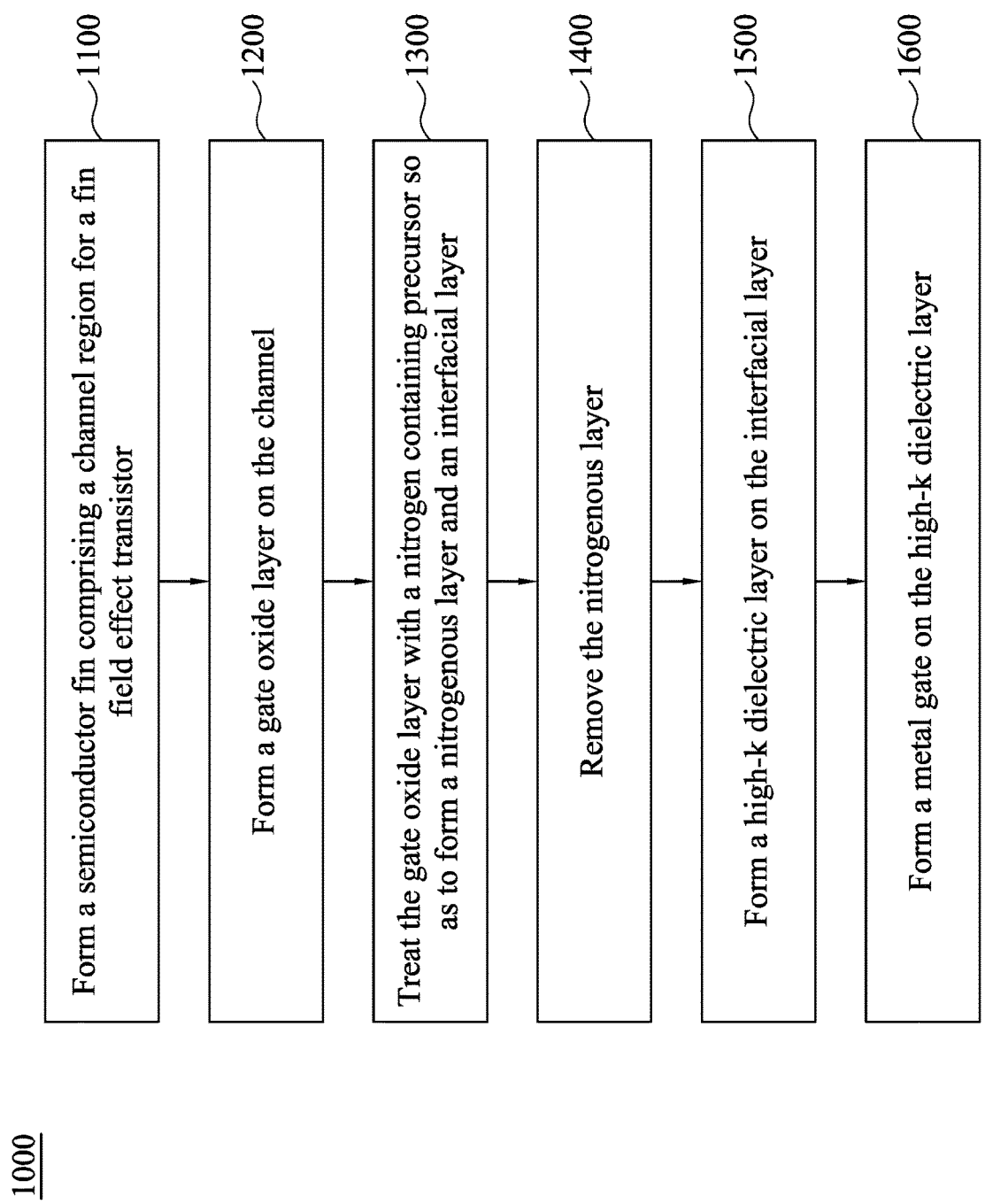
FIG. 1 is a flow chart illustrating a method of fabricating a semiconductor device in accordance with some embodiments of the instant disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Various embodiments include gate oxides over channel regions of fin field effect transistors (finFETs) in a die and methods of forming thereof. The operating voltage of finFETs in the die may vary, and the thickness of the gate oxides of each finFET may be configured in accordance with the finFET's materials and operating voltage. For example, lower operating voltage finFETs may have high-k dielectrics and thinner gate oxides whereas higher operating voltage finFETs may have thicker gate oxides. The formation of such gate oxides may include a treatment process with nitrogen containing agent in combination with a suitable rinsing process, which may improve the conformity of the gate oxides.

Referring to FIG. 1, a flow chart of a method 1000 of fabricating a semiconductor device in accordance with some embodiments of the instant disclosure. The method begins with operation 1100 in which a semiconductor fin including a channel region for a finFET is formed. The method continues with operation 1200 in which a gate oxide layer is formed on the channel. Subsequently, operation 1300 is performed. The gate oxide layer is treated with a nitrogen containing agent so as to form a nitrogenous layer and an interfacial layer. The method continues with operation 1400 in which the nitrogenous layer is removed. The method continues with operation 1500 in which a high-k dielectric layer is formed on the interfacial layer. The method continues with operation 1600 in which a metal gate is formed on the high-k dielectric layer. The discussion that follows illustrates embodiments of semiconductor devices that can be fabricated according to the method 1000 of FIG. 1. While method 1000 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 2:
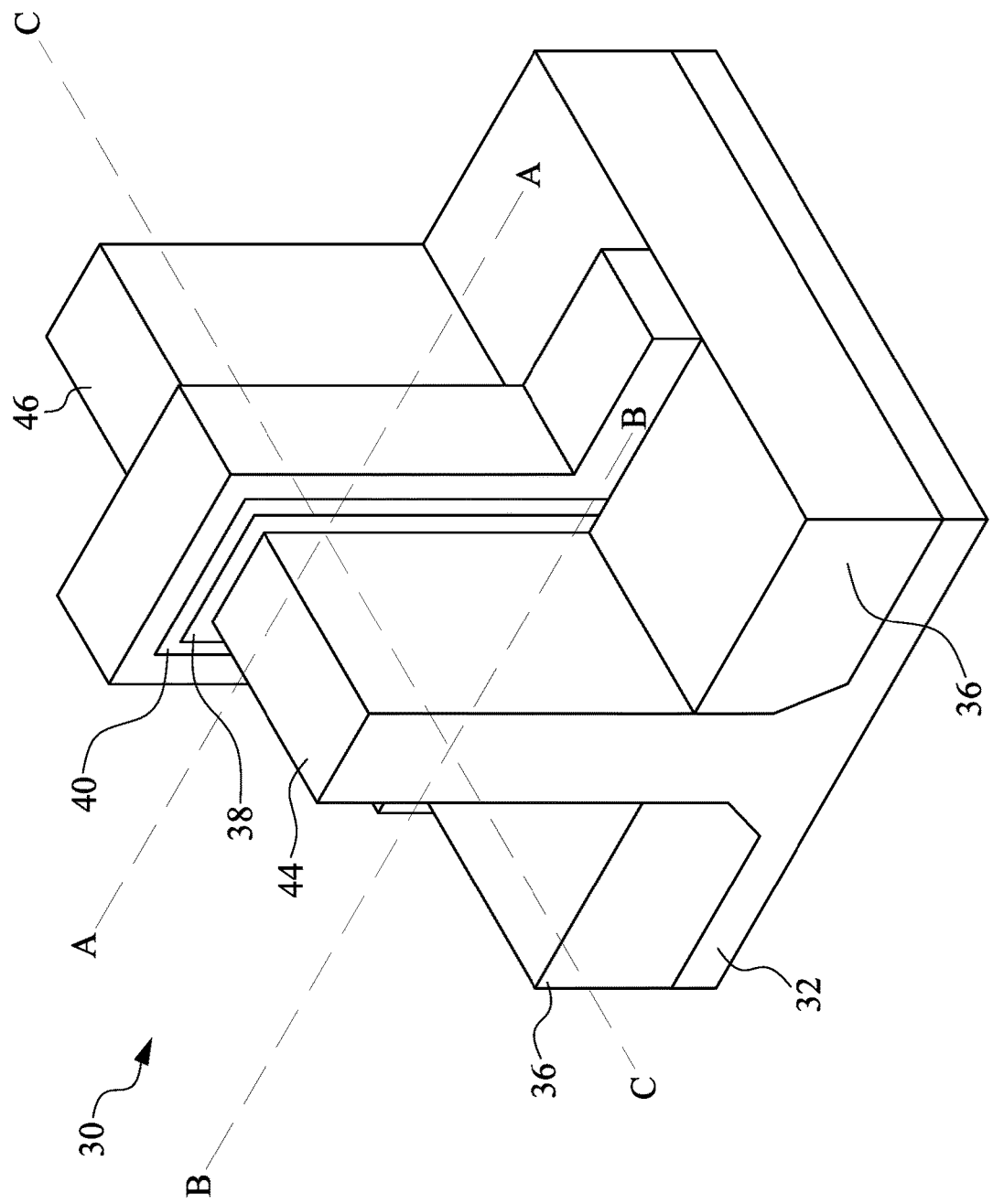
FIG. 2 is an example of a Fin Field-Effect Transistor (finFET) in a three-dimensional view.

Reference is made to FIG. 2, illustrating an example of a finFET 30 in a three-dimensional view. FinFET 30 includes a fin 34 on a substrate 32. Substrate 32 includes isolation regions 36, and fin 34 protrudes above and from between neighboring isolation regions 36. A conformal gate dielectric 38 is disposed along sidewalls and over a top surface of fin 34. A high-k dielectric liner 40 and a conductive gate electrode 42 are disposed over conformal gate dielectric 38. Portions of fin 34 covered by gate dielectric 38/high-k dielectric liner 40/gate electrode 42 may be referred to as a channel region of finFET 30. Source/drain regions 44 and 46 are disposed in opposite sides of fin 34 with respect to the gate dielectric 38, high-k dielectric liner 40, and gate electrode 42. FIG. 2 further illustrates reference cross-sections that are used in later figures. Cross-section A-A is across a channel, gate dielectric 38, high-k dielectric liner 40, and gate electrode 42 of finFET 30. Cross-section B-B is across a source/drain region 44 or 46 of the finFET 30. Cross-section C-C is perpendicular to cross-section A-A and is along a longitudinal axis of fin 34 and in a direction of, for example, a current flow between the source/drain regions 44 and 46. Subsequent figures refer to these reference cross-sections for clarity.

FIGS. 3 through 18C are cross-sectional views of various intermediary stages in the manufacturing of finFETs in accordance with various embodiments, and FIG. 1 is a process flow of the process shown in FIGS. 3 through 18C. FIGS. 3 through 6 illustrate reference cross-section A-A illustrated in FIG. 2, except for multiple finFETs and/or finFETs having multiple fins. As discussed above, in FIGS. 8A through 18C, figures ending with an "A" designation are illustrated along a similar cross-section A-A; figures ending with a "B" designation are illustrated along a similar cross-section B-B; and figures ending with a "C" designation are illustrated along a similar cross-section C-C.

Figure 3:
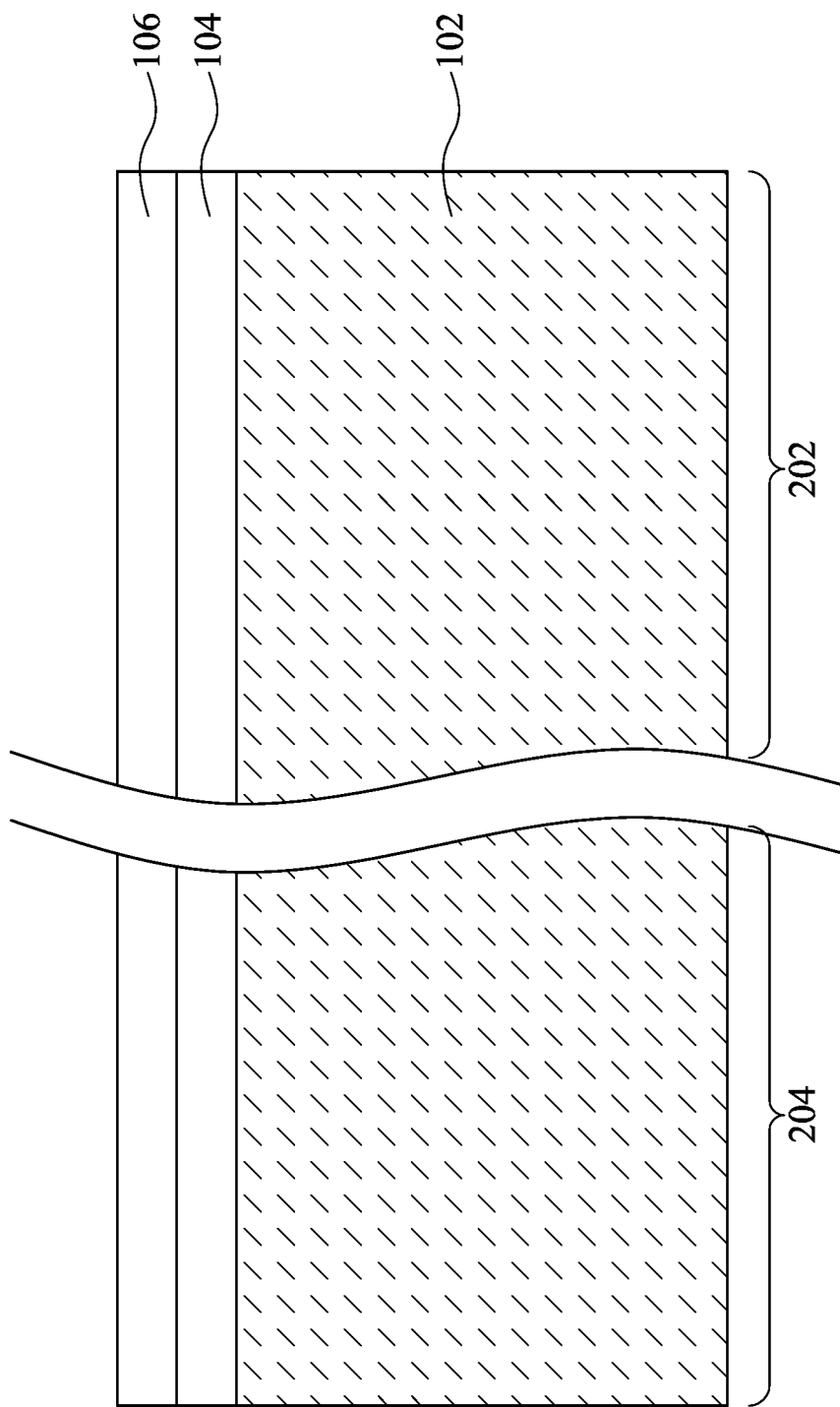
FIGS. 3 through 18C illustrate cross-sectional views of intermediary stages of the manufacturing a finFET in accordance with some embodiments.
Figure 4:
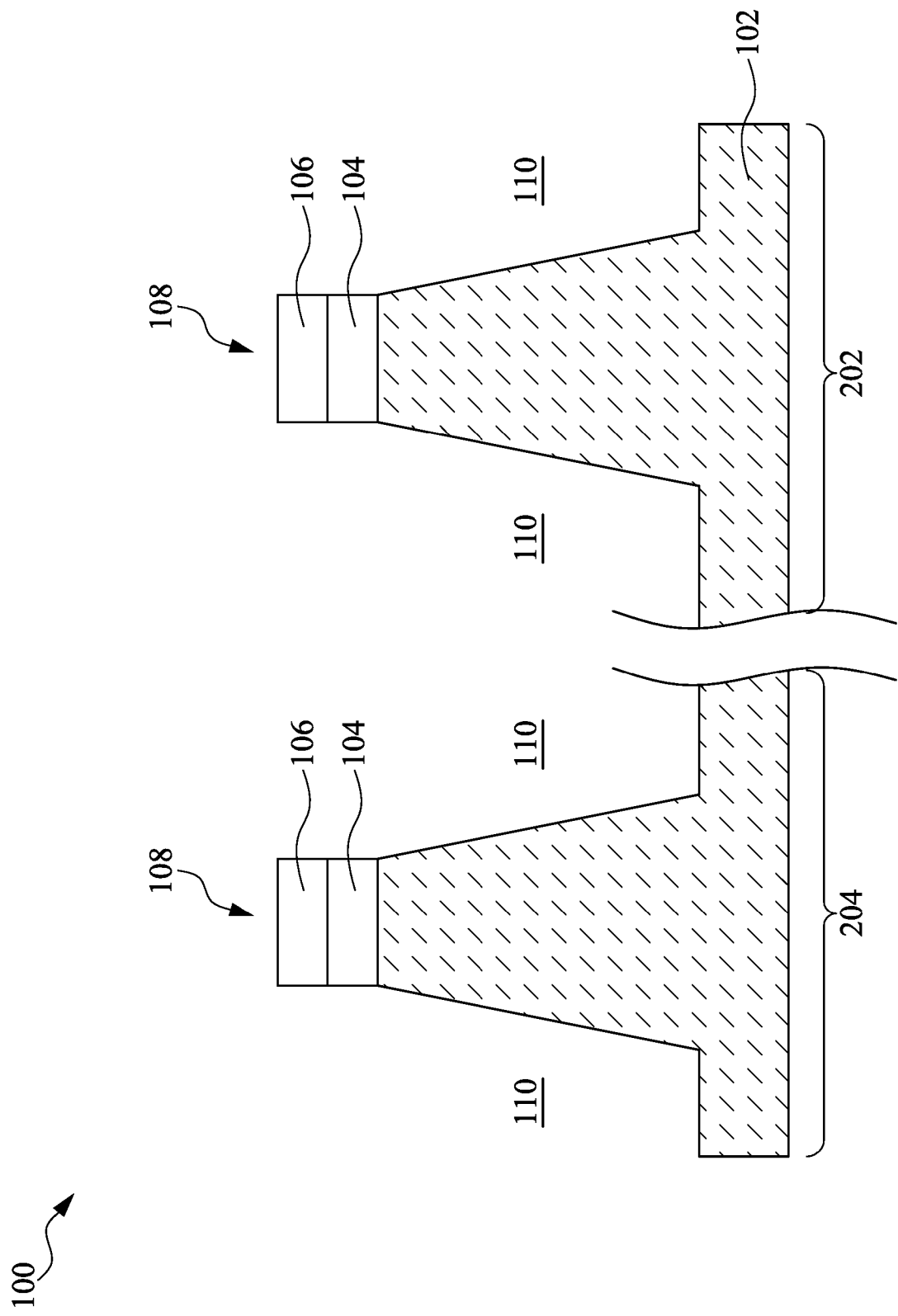

FIGS. 3 and 4 illustrate the formation of semiconductor fins extending upwards from a substrate. Reference is made FIG. 2, illustrating a wafer 100 having a semiconductor substrate 102. Semiconductor substrate 102 includes a high-voltage region 202 for forming finFET devices having a relatively high operating voltage and a low voltage region 204 for forming finFET devices a relatively low operating voltage. In some embodiments, high-voltage region 202 may include finFETs having a threshold voltage of about of about 1.5 volts (V), about 1.8 V, or even higher. In contrast, low voltage region 204 may include finFETs having a threshold voltage of about 0.9 V, about 0.75V, or even lower. In such embodiments, high-voltage region 202 may include input/output transistors, which convert a higher threshold, input voltage (e.g., power supply voltage) to a lower threshold voltage suitable for operating core transistors (e.g., logic, memory, or the like) in low voltage region 204. Regions 202 and 204 may or may not be contiguous and any number of device features (e.g., isolation regions, dummy features, or the like, not shown) may be formed between high-voltage region 202 and low voltage region 204 depending on device design. Furthermore, devices in high-voltage region 202 and/or low voltage region 204 may have different operating voltages than those explicitly discussed above depending on device design.

Semiconductor substrate 102 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of semiconductor substrate 102 may include silicon (Si); germanium (Ge); a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Reference is made to FIG. 3 again. Hard mask 104 and photoresist 106 may be disposed over semiconductor substrate 102. Hard mask 104 may include one or more oxide (e.g., silicon oxide) and/or nitride (e.g., silicon nitride) layers to prevent damage to the underlying semiconductor substrate 102 during patterning. Hard mask 104 may be formed using any suitable deposition process, such as, atomic layer deposition (ALD), chemical vapor deposition (CVD), high density plasma CVD (HDP-CVD), physical vapor deposition (PVD), and the like. Photoresist 106 may comprise any suitable photosensitive material blanket deposited using a suitable process, such as, spin on coating, and the like.

Reference is made to FIG. 4, illustrating the patterning of semiconductor substrate 102 to form fins 108 disposed between adjacent trenches 110. In some embodiments, photoresist 106 may first be patterned by exposing photoresist 106 to light using a photomask. Exposed or unexposed portions of photoresist 106 may then be removed depending on whether a positive or negative resist is used.

Reference is still made to FIG. 4. The pattern of photoresist 106 may then be transferred to hard mask 108 (e.g., using a suitable etching process). Subsequently, trenches 110 are patterned into underlying substrate 102 using hard mask 104 as a patterning mask during an etching process, for example. The etching of substrate 102 may include acceptable etch processes, such as a reactive ion etch (RIE), neutral beam etch (NBE), the like, or a combination thereof. The etching may be anisotropic. Subsequently, photoresist 106 is removed in an ashing and/or wet strip processes, for example. Hard mask 104 may also be removed. Thus, fins 108 are formed in wafer 100. Fins 108 extend upwards from substrate 102 between adjacent trenches 110. In alternative embodiments (not shown), fins 108 (or portions of fins 108) may be epitaxially grown from underlying substrate 102 in addition to or in lieu of patterning substrate 102. In such embodiments, dopants of an appropriate type (e.g., p-type and/or n-type impurities) may be in-situ doped during the epitaxy.

Figure 5:
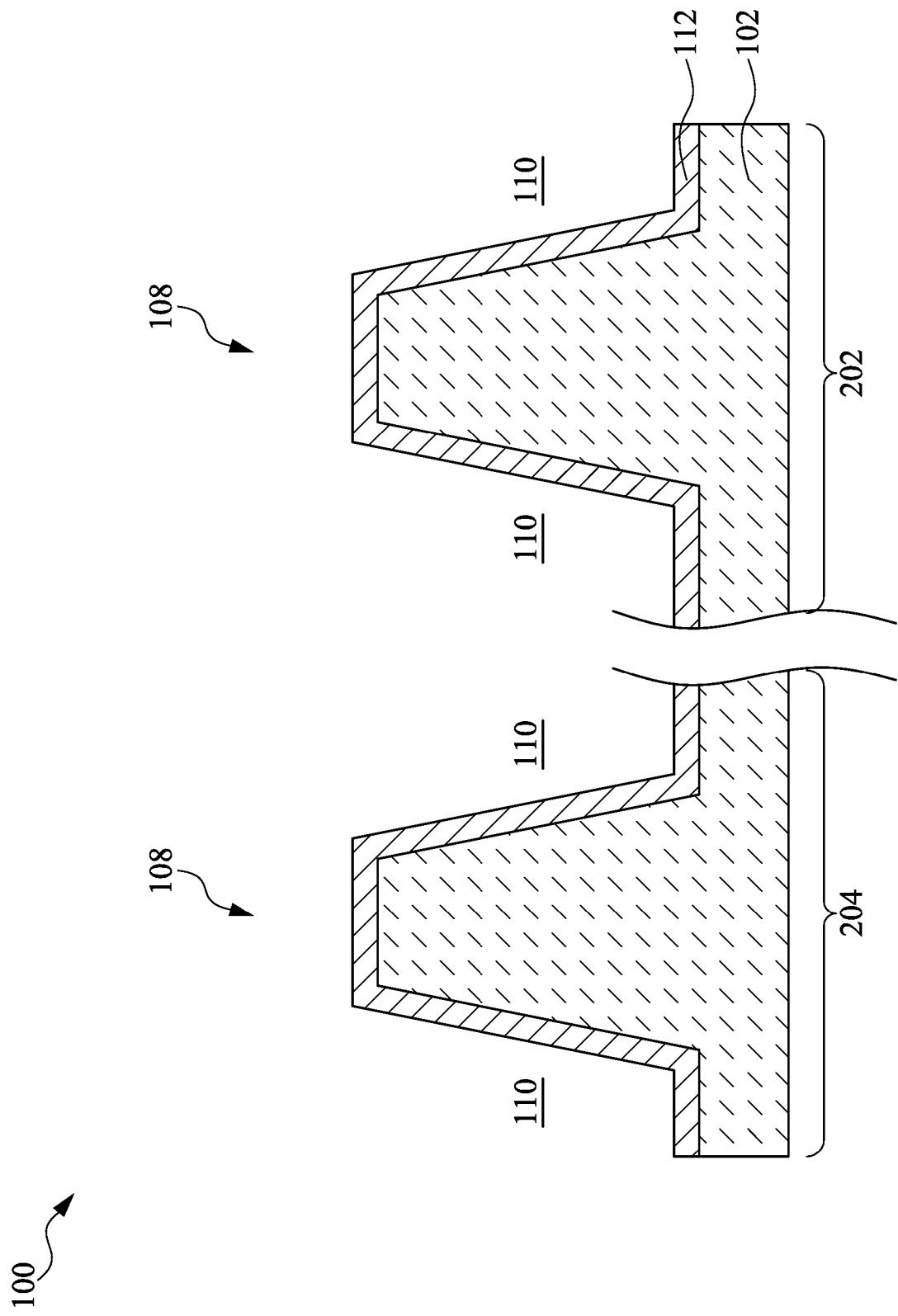
Figure 6:
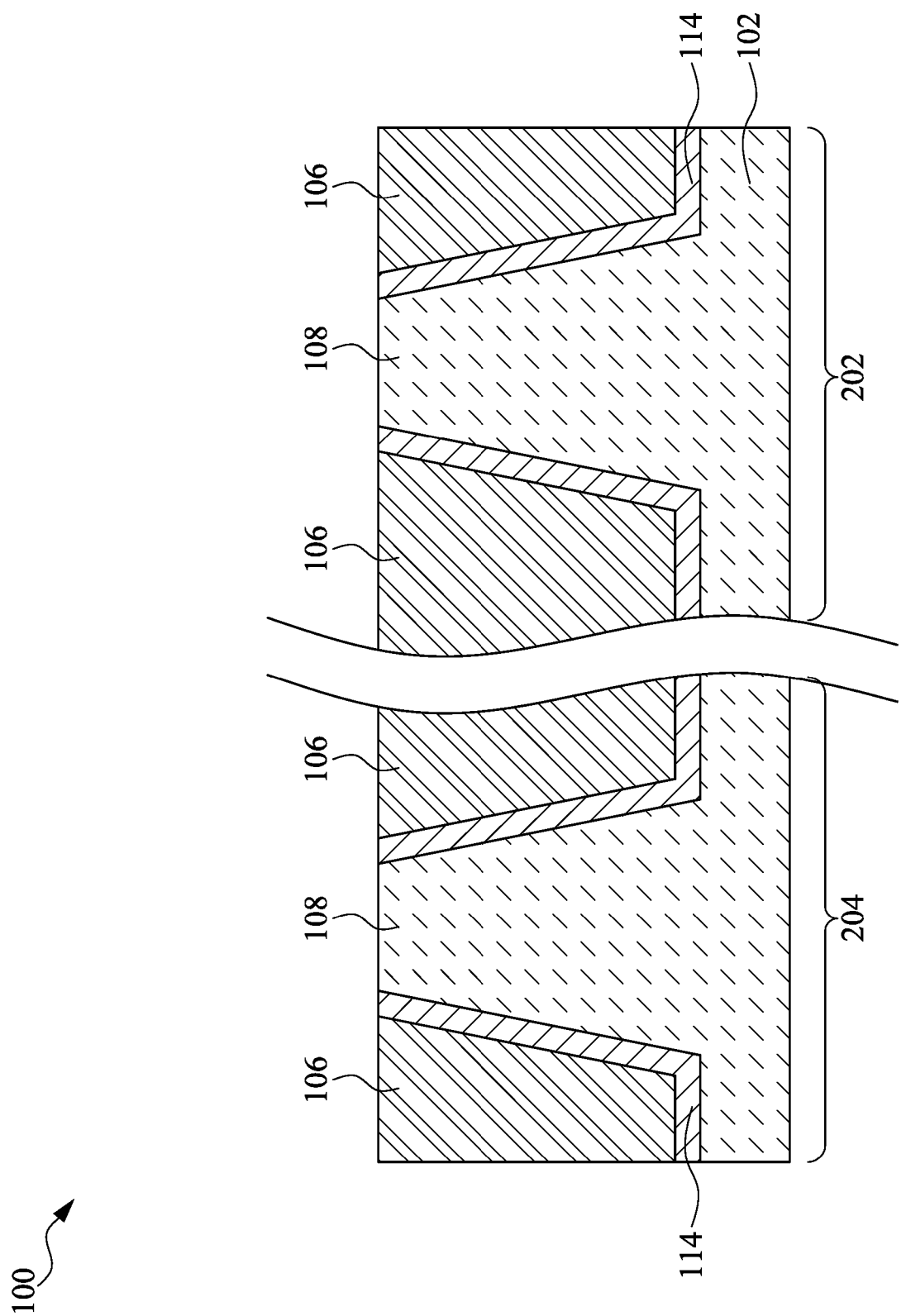

Reference is made to FIGS. 5 and 6, illustrating shallow trench isolation (STI) regions formed in wafer 100. First, as illustrated by FIG. 5, a liner 112, such as a diffusion barrier layer, may be disposed along sidewalls of bottom surfaces of trenches 110. In some embodiments, liner 112 may include a semiconductor (e.g., silicon) nitride, a semiconductor (e.g., silicon) oxide, a thermal semiconductor (e.g., silicon) oxide, a semiconductor (e.g., silicon) oxynitride, a polymer dielectric, combinations thereof, and the like. The formation of liner 112 may include any suitable method, such as, atomic layer deposition (ALD), CVD, high density plasma (HDP) CVD, physical vapor deposition (PVD), and the like.

Next, as illustrated by FIG. 6, trenches 110 may be filled with a dielectric material, such as, silicon oxide, silicon nitride, silicon oxynitride, fluoride-doped silicate glass (FSG), or the like. In some embodiments, the resulting STI regions 116 may be formed using a high-density-plasma (HDP) CVD process, using silane ($SiH_4$) and oxygen ($O_2$) as reacting precursors. In other embodiments, STI regions 116 may be formed using a sub-atmospheric CVD (SACVD) process or high aspect-ratio process (HARP), wherein process gases may comprise tetraethylorthosilicate (TEOS) and ozone ($O_3$). In yet other embodiments, STI regions 116 may be formed using a spin-on-dielectric (SOD) process, such as hydrogen silsesquioxane (HSQ) or methyl silsesquioxane (MSQ). An annealing (or other suitable process) may be performed to cure the material of STI regions 116, and liner 114 may prevent (or at least reduce) the diffusion of semiconductor material from fins 108 into the surrounding STI regions 116 during the annealing. Other processes and materials may be used. A chemical mechanical polish (CMP) or etch back process may be used to level a top surfaces of STI regions 116, liner 114, and fins 108.

Figure 7:
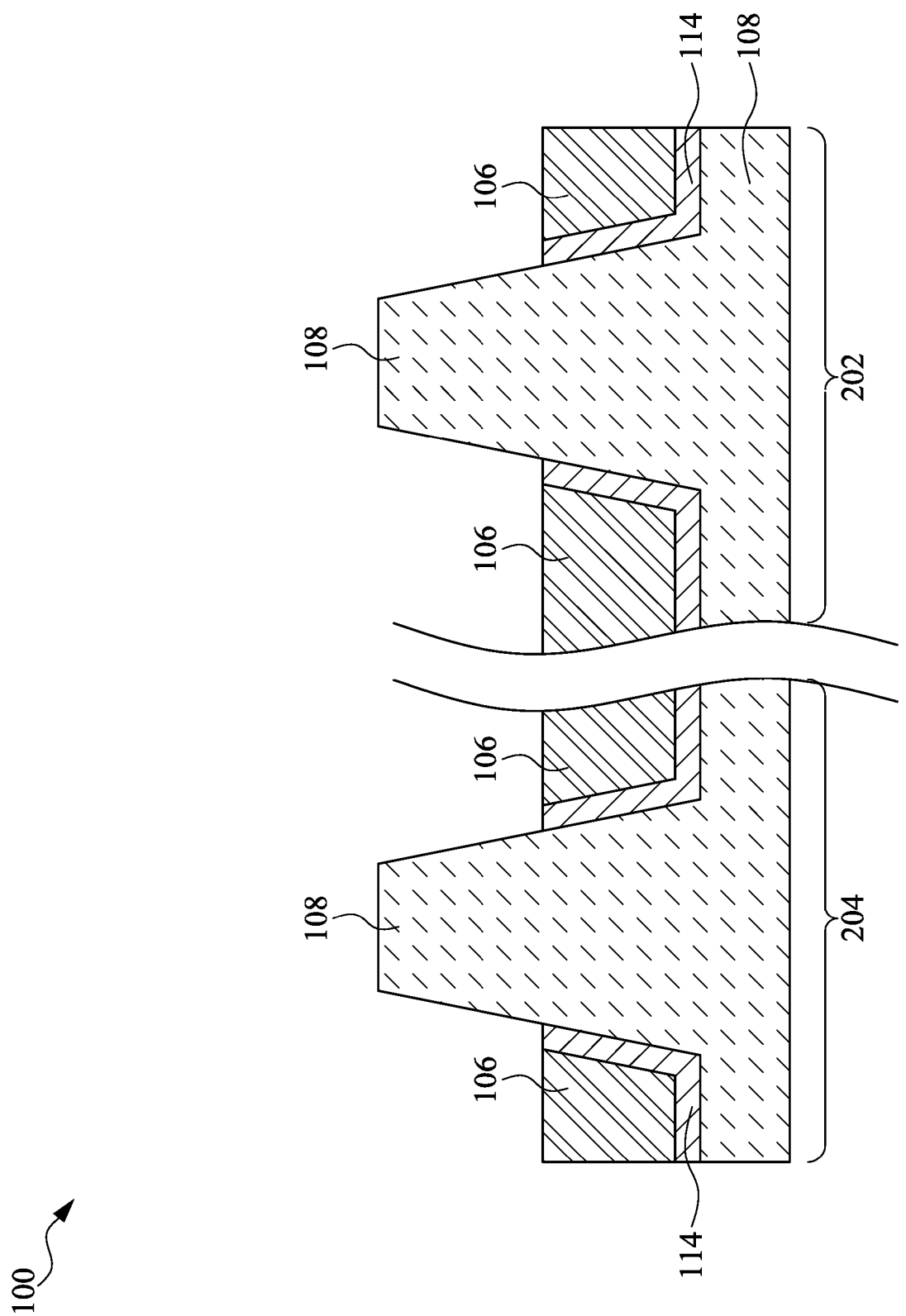

In FIG. 7, STI regions 116 are recessed, so that top portions of semiconductor fins 108 are higher than the top surfaces of STI regions 116. The recessing of STI regions 116 may include a chemical etch process, for example, using ammonia ($NH_3$) in combination with hydrofluoric acid (HF) or nitrogen trifluoride ($NF_3$) as reaction solutions either with or without plasma. Liner 114 may also be recessed to be substantially level with recessed STI regions 116. After recessing, top surface and sidewalls of fins 108 are exposed. Channel regions 118 (e.g., exposed portions of fins 108 along cross-section A-A, see e.g., FIG. 8A) are thus formed in fins 108. In the completed finFET structure, a gate stack wraps around and covers sidewalls of such channel regions 118 (see e.g., FIGS. 2 and 18A).

Figure 8A:
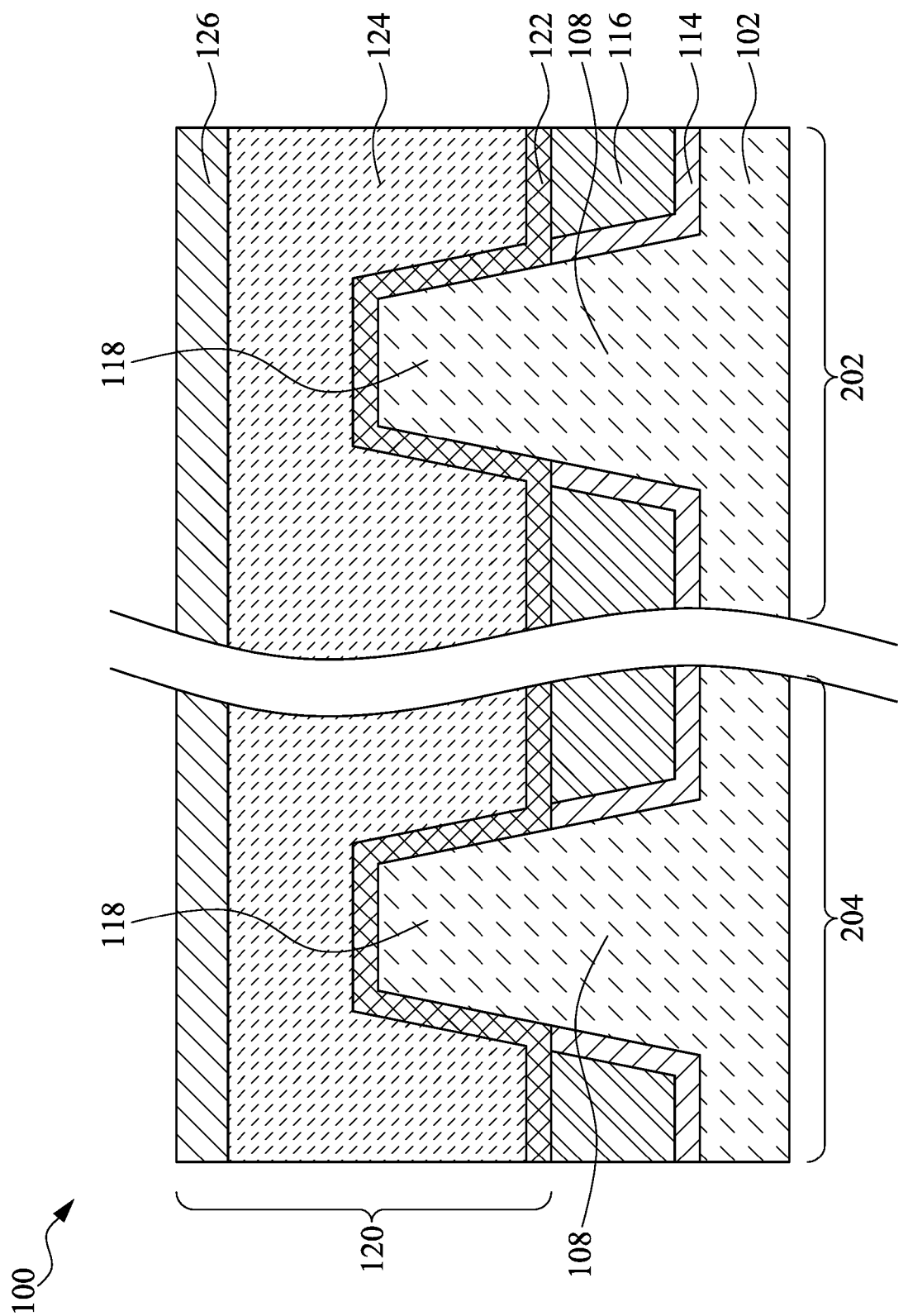
Figure 8B:
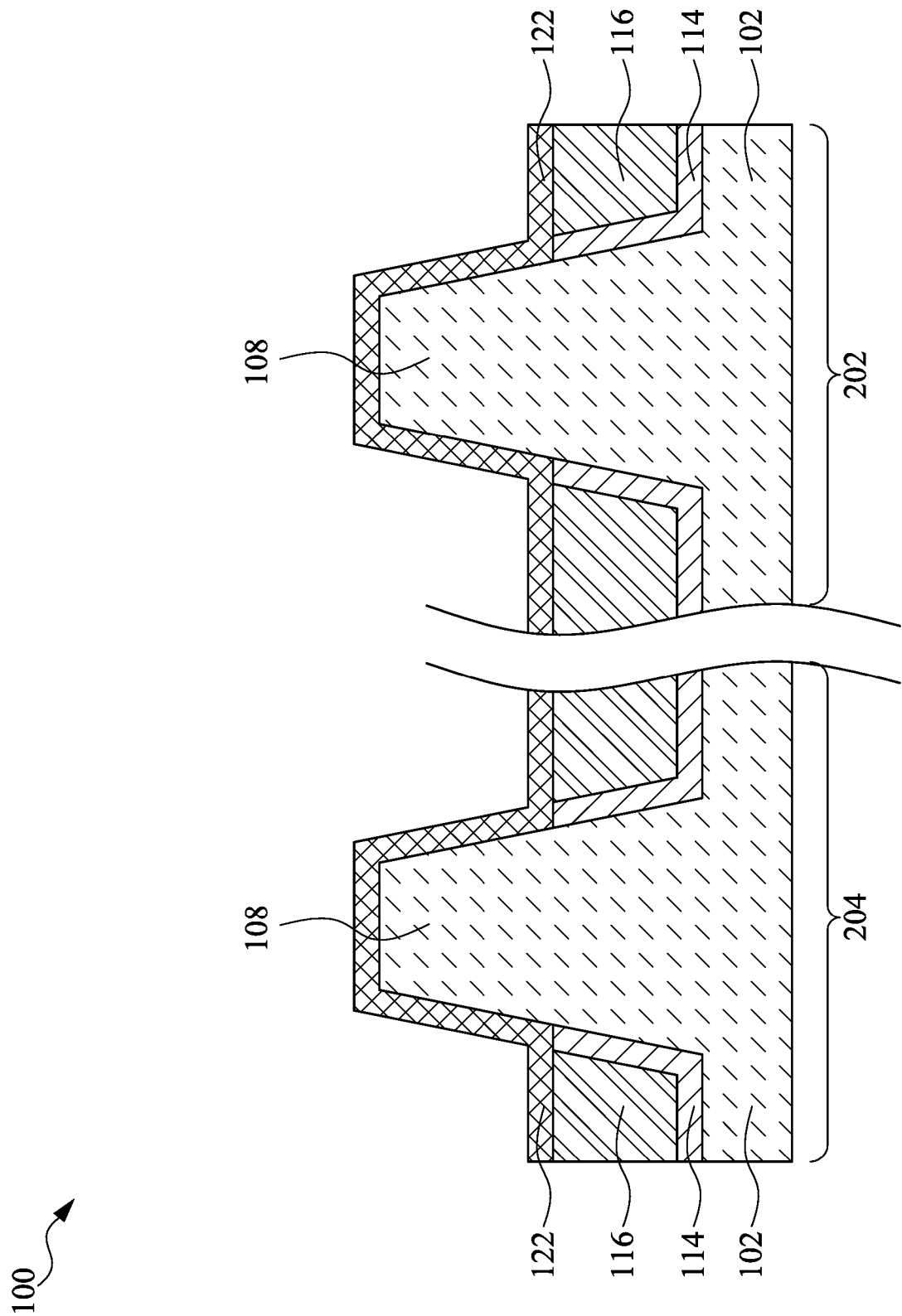
Figure 8C:
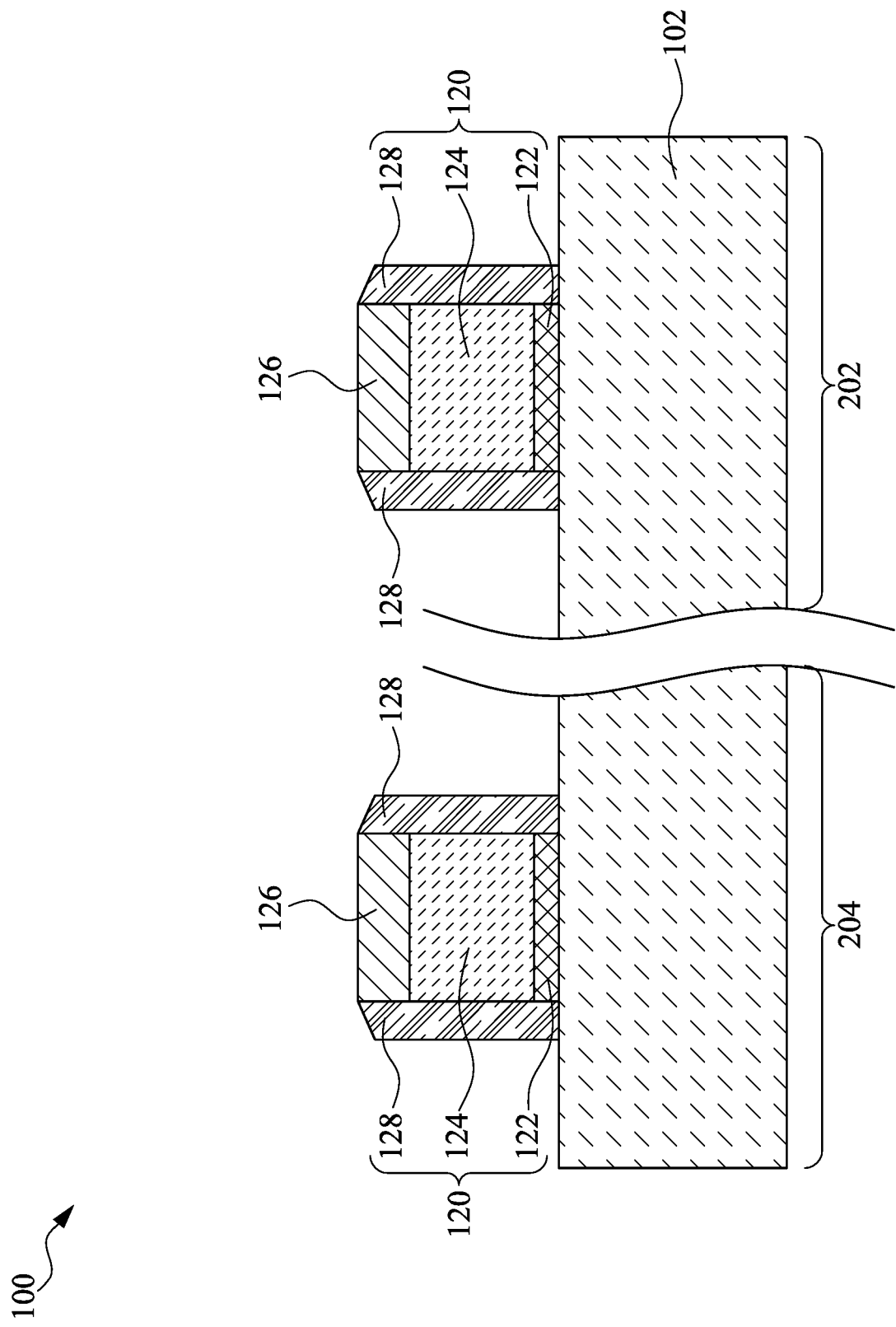

FIGS. 8A through 8C illustrate the formation of dummy gate stacks 120 on a top surface and the sidewalls of channel region 118. Gate stacks 120 include a conformal dummy oxide 122 and a dummy gate 124 over dummy oxide 122. Dummy gate 124 may comprise, for example, polysilicon, although materials such as metal silicides, metal nitrides, or the like, may also be used. Each gate stack 120 may further include a hard mask 126 over dummy gate 124. Hard mask 126 may include silicon nitride or silicon oxide, for example. Each gate stack 120 may cross over a plurality of semiconductor fins 108 and/or STI regions in some embodiments. Gate stacks 120 may also have a lengthwise direction substantially perpendicular to the lengthwise direction of semiconductor fins 108 (see e.g., FIG. 2). The formation of gate stacks 120 may further include forming dummy oxide 122 over sidewalls and a top surface of source/drain regions of fins 108 as illustrated by FIG. 8B. However, dummy gate 124 and hard mask 126 may be omitted from such source/drain regions of fins 108.

As also shown in FIG. 8C, gate spacers 128 are formed on the sidewalls of gate stacks 120. In some embodiments, gate spacers 128 are formed of silicon oxide, silicon nitride, silicon carbon nitride, or the like. Furthermore, gate spacers 128 may have a multi-layer structure, for example, with a silicon nitride layer over a silicon oxide layer.

Figure 9A:
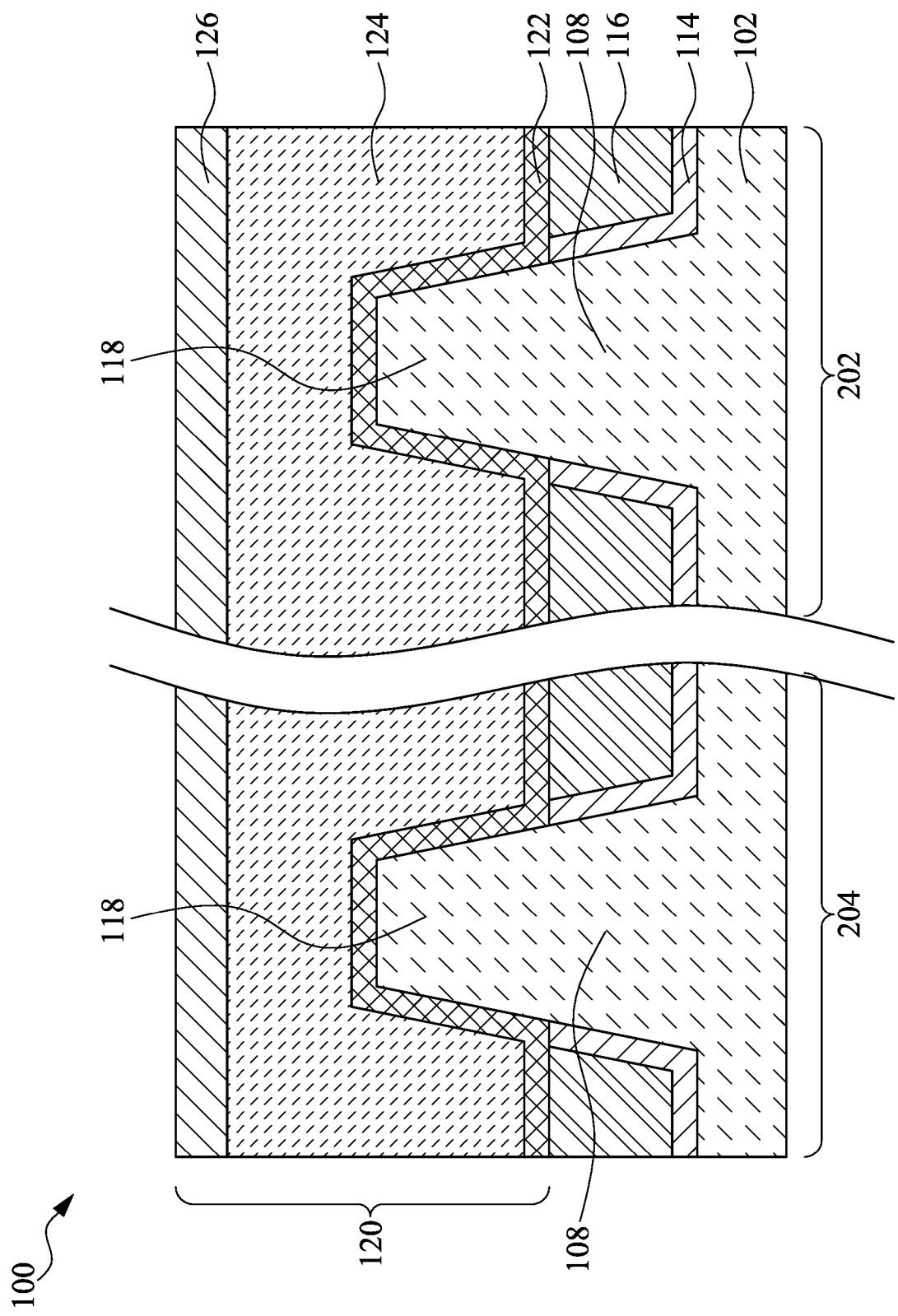
Figure 9B:
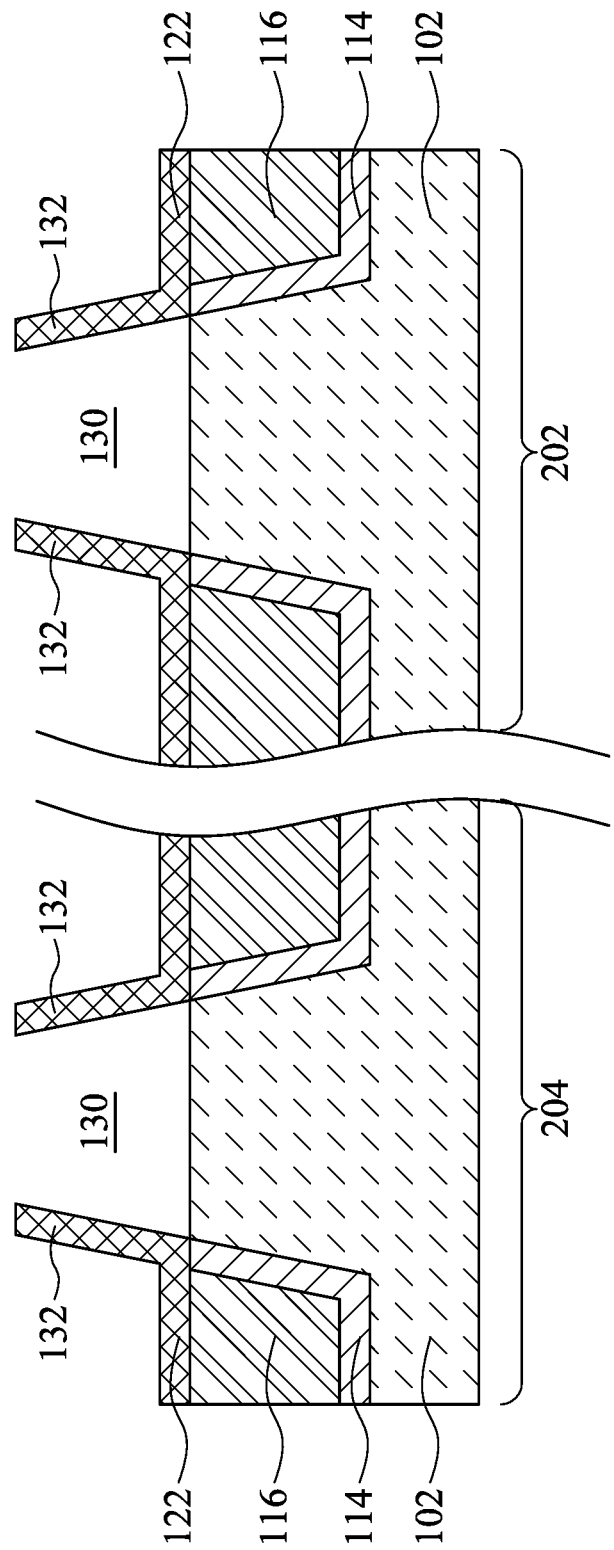
Figure 9C:
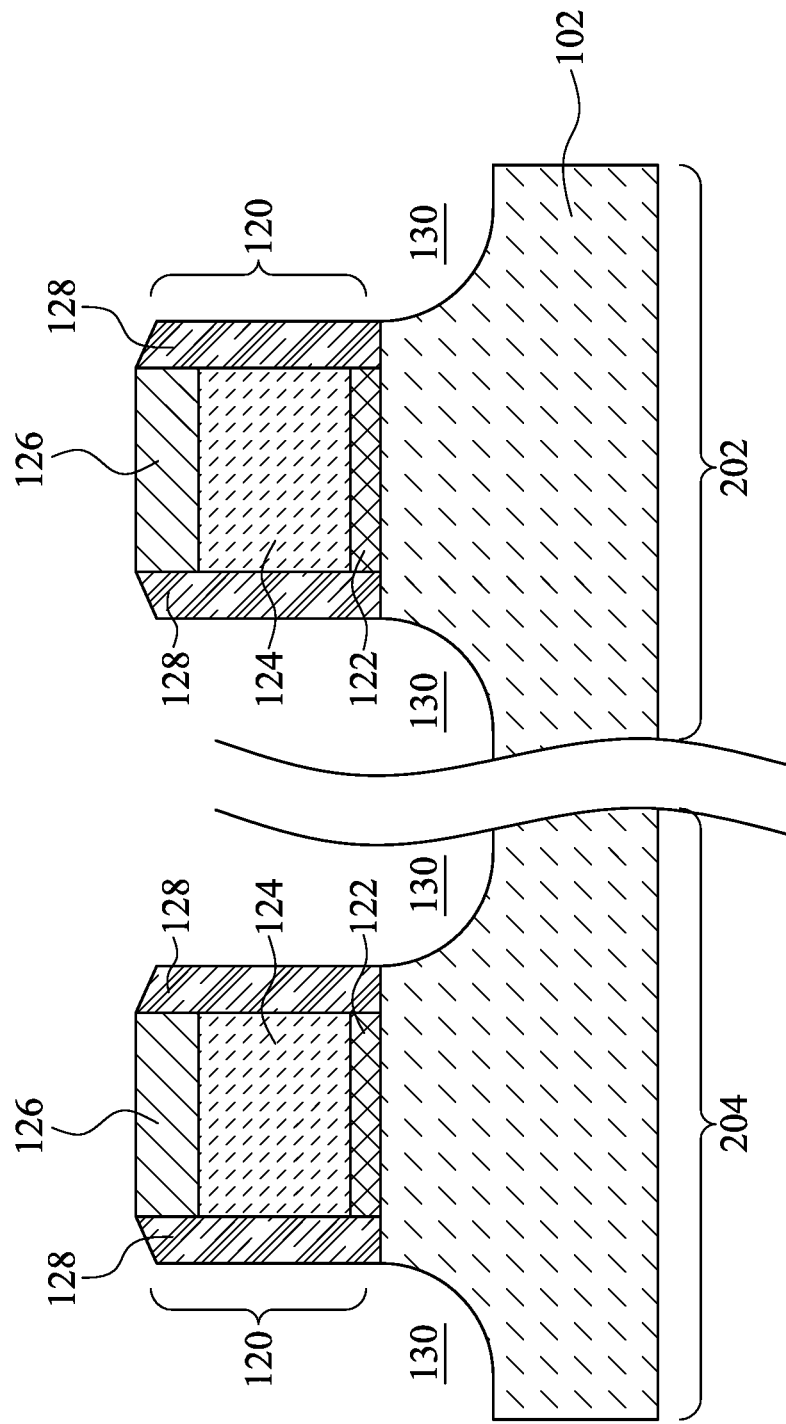

Referring to FIGS. 9A through 9C, an etching is performed to etch portions of semiconductor fins 108 that are not covered by hard mask 126 or gate spacers 128. The etching may further remove portions of dummy oxide 122 not covered by hard mask 126, which may correspond to portions of dummy oxide 122 over source/drain regions of fins 108 (see FIG. 9B). After etching, remaining portions of dummy oxide 122 may be used as major sidewall (MSW) spacers 132 for defining source/drain epitaxy areas in subsequent process steps. Alternatively, fins 108 may be recessed past a top surface of STI regions 116, and exposed sidewalls of STI regions 116 may be used to define source/drain epitaxy regions. In such embodiments, spacers 132 may be omitted. Trenches 130 are accordingly formed between adjacent spacers 132. Trenches 130 are located on opposite sides of dummy gate stack 120 (see FIG. 9C). After the formation of trenches 130, a lightly doped drain (LDD) and annealing processes may be performed on exposed surfaces of fins 108.

Figure 10A:
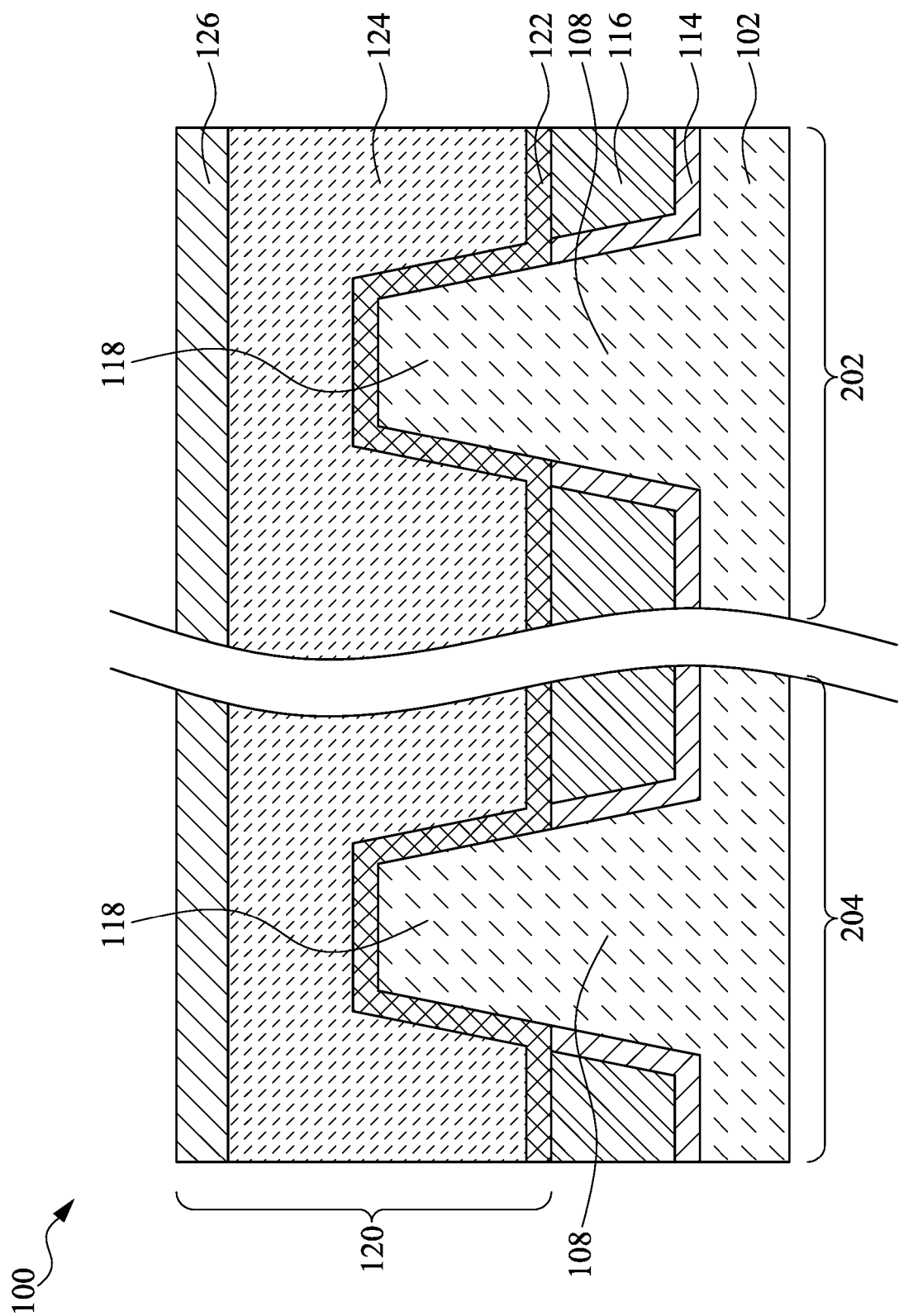
Figure 10B:
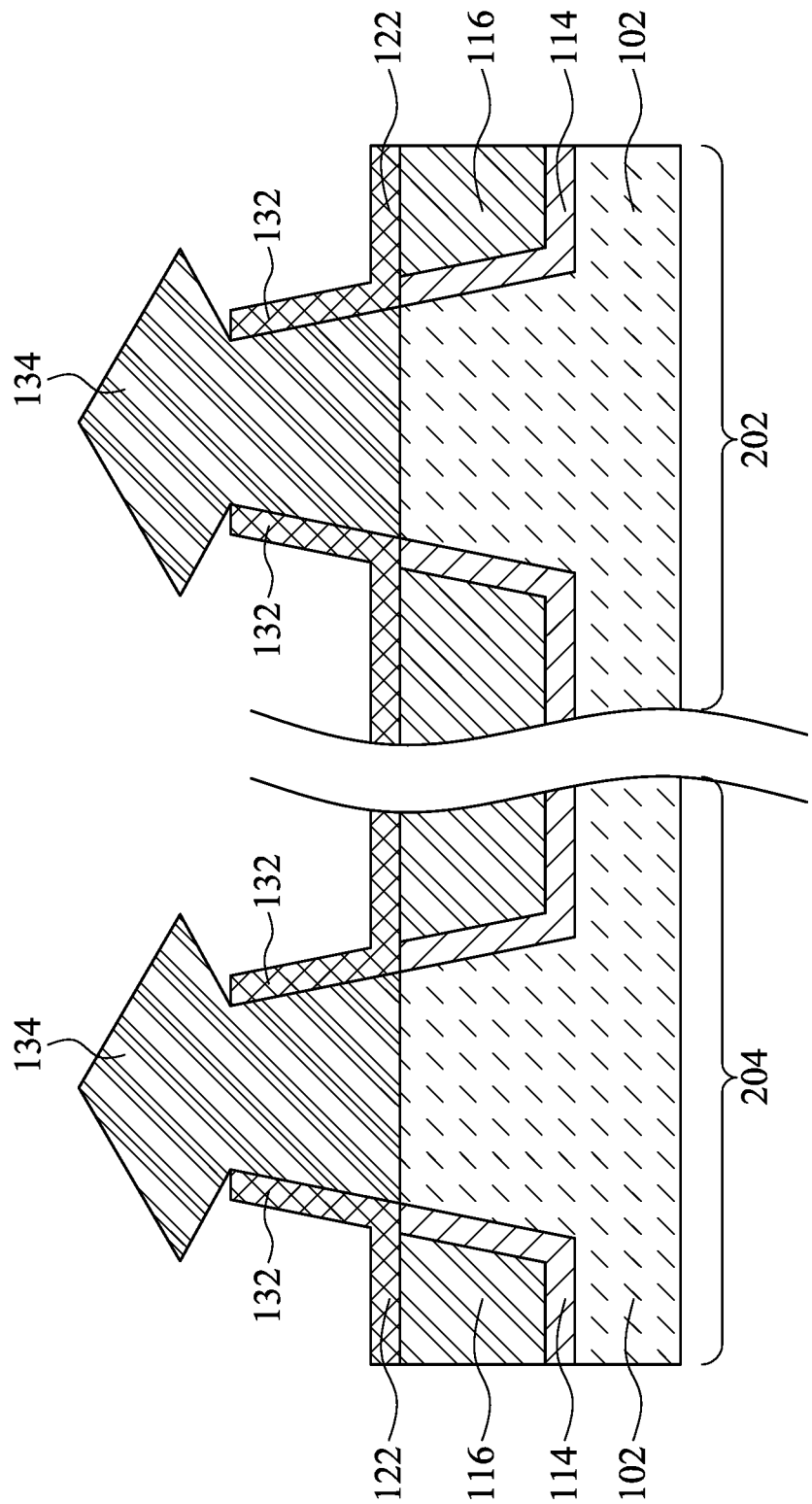
Figure 10C:
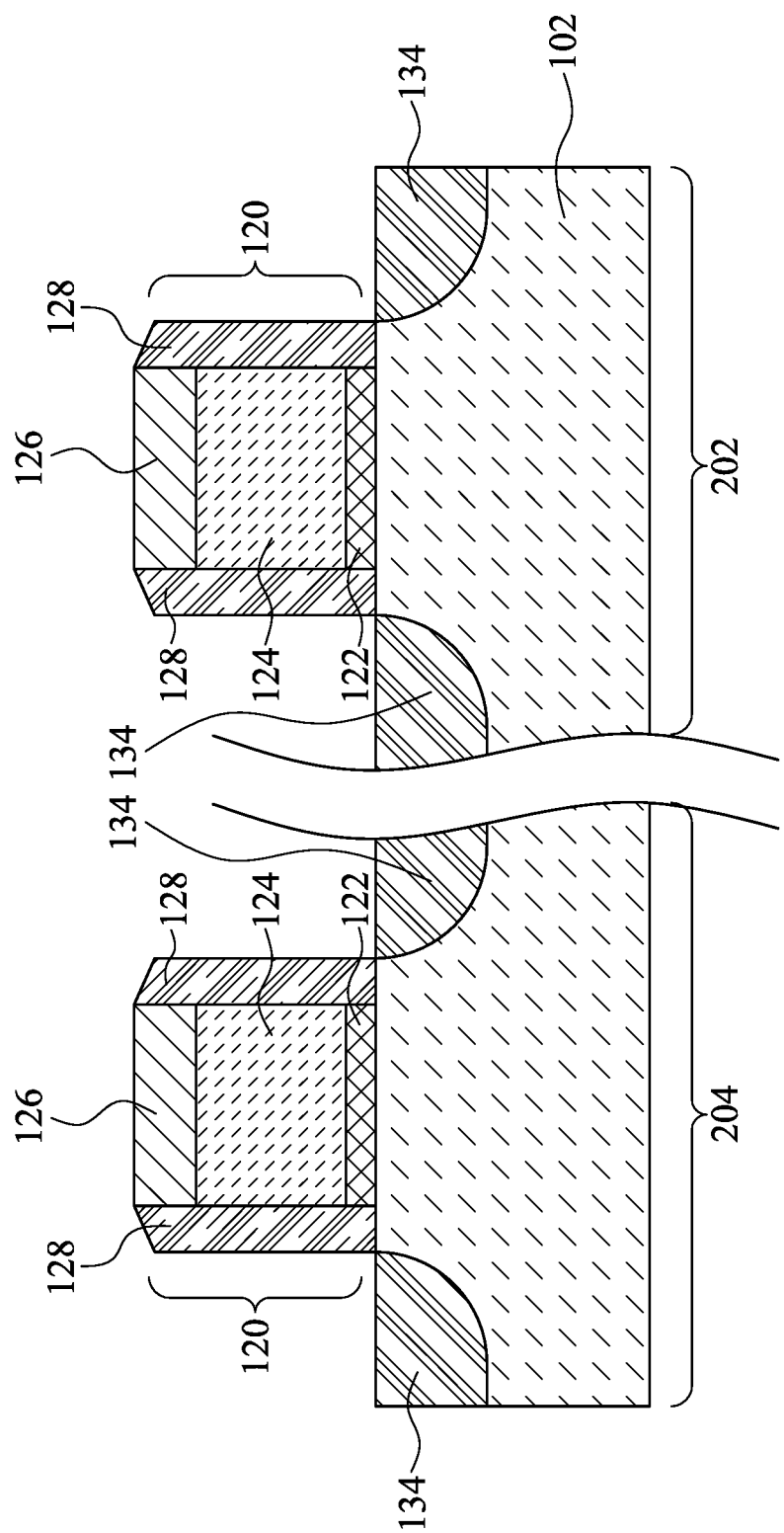

Next, as shown in FIGS. 10A through 10C, epitaxy regions 134 are formed by selectively growing a semiconductor material in trenches 130. In some embodiments, epitaxy regions 134 include silicon (with no germanium), germanium (with no silicon), silicon germanium, silicon phosphorous, or the like. Epitaxy regions 134 may also be formed of pure or substantially pure germanium, for example, with a germanium atomic percentage greater than about 95%. Hard mask 126 and spacers 132 may mask areas of wafer 100 to define an area for forming epitaxy regions 134 (e.g., only on exposed portions of fins 108). After trenches 130 are filled with epitaxy regions 134, the further epitaxial growth of source/drain regions causes epitaxy regions 134 to expand horizontally, and facets may start to form. Furthermore, some portions of STI regions 116 may be underlying and aligned to portions of epitaxy regions 134 due to the lateral growth of source/drain regions.

After the epitaxy step, epitaxy regions 134 may be implanted with p-type impurities (e.g., boron or BF2) for PMOS devices or n-type impurities (e.g., phosphorous or arsenic) for NMOS devices to form source/drain regions, which are also denoted using reference numeral 134. Alternatively, the p-type or n-type impurity may be in-situ doped when epitaxy regions 134 are grown to form source/drain regions. Source/drain regions 134 are on the opposite sides of gate stack 120 (see FIG. 10C), and may be overlying and overlapping portions of surfaces of STI regions 116. In yet alternative embodiments, the patterning of fin 108 and subsequent epitaxy may be omitted. In such embodiments, source/drain regions 134 may simply be disposed on opposing sides of each gate stack 120/gate spacers 128.

Figure 11A:
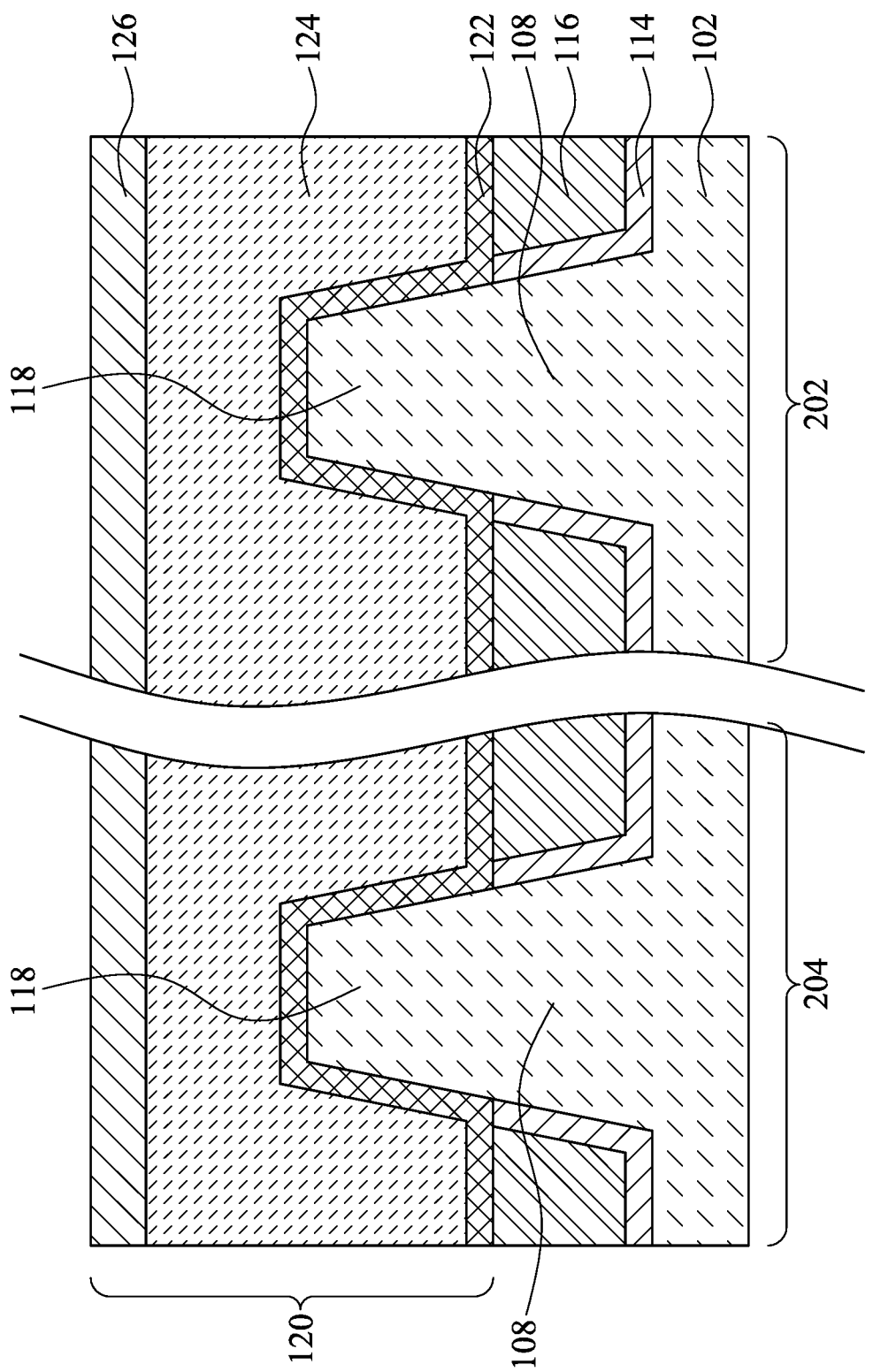
Figure 11B:
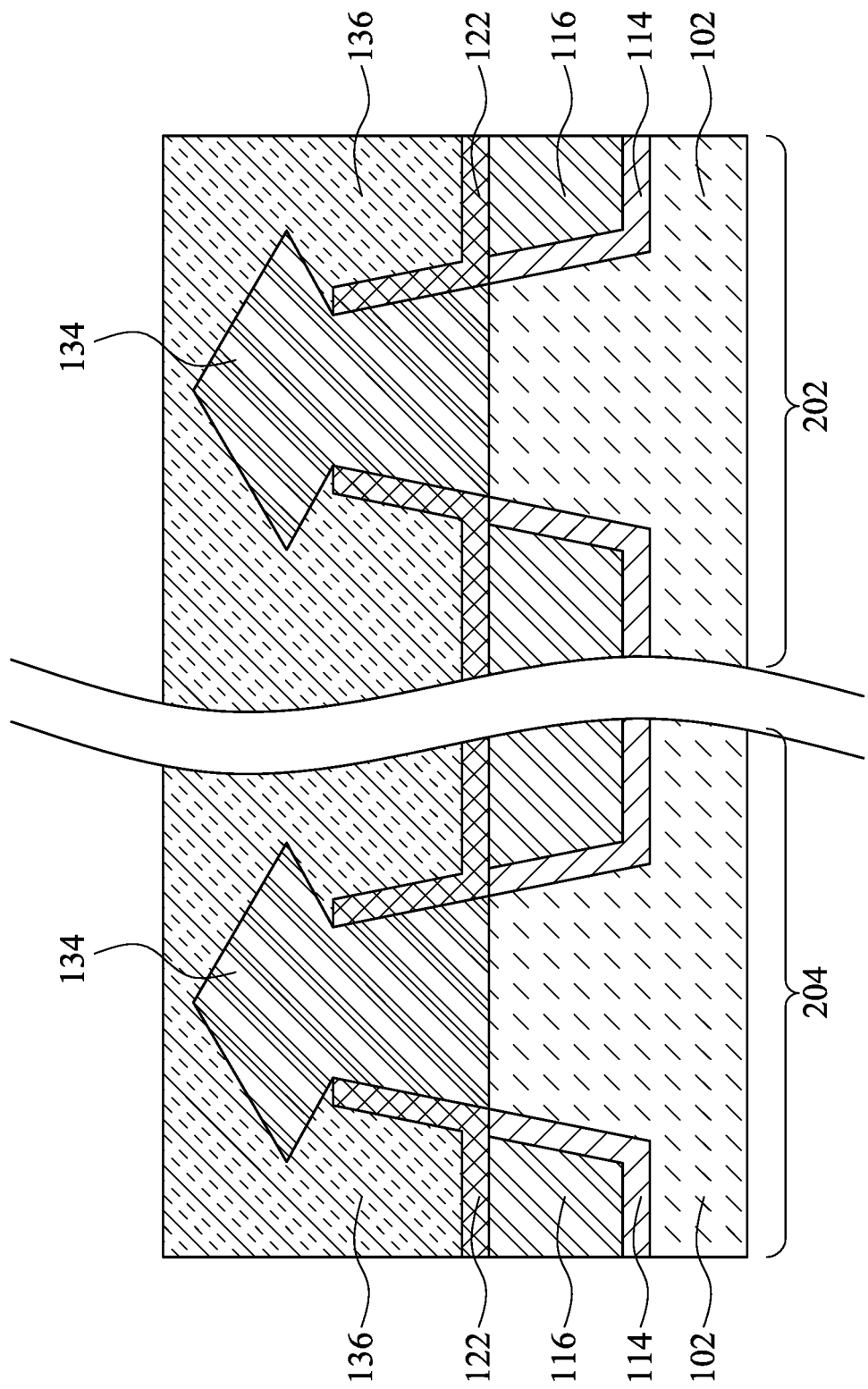
Figure 11C:
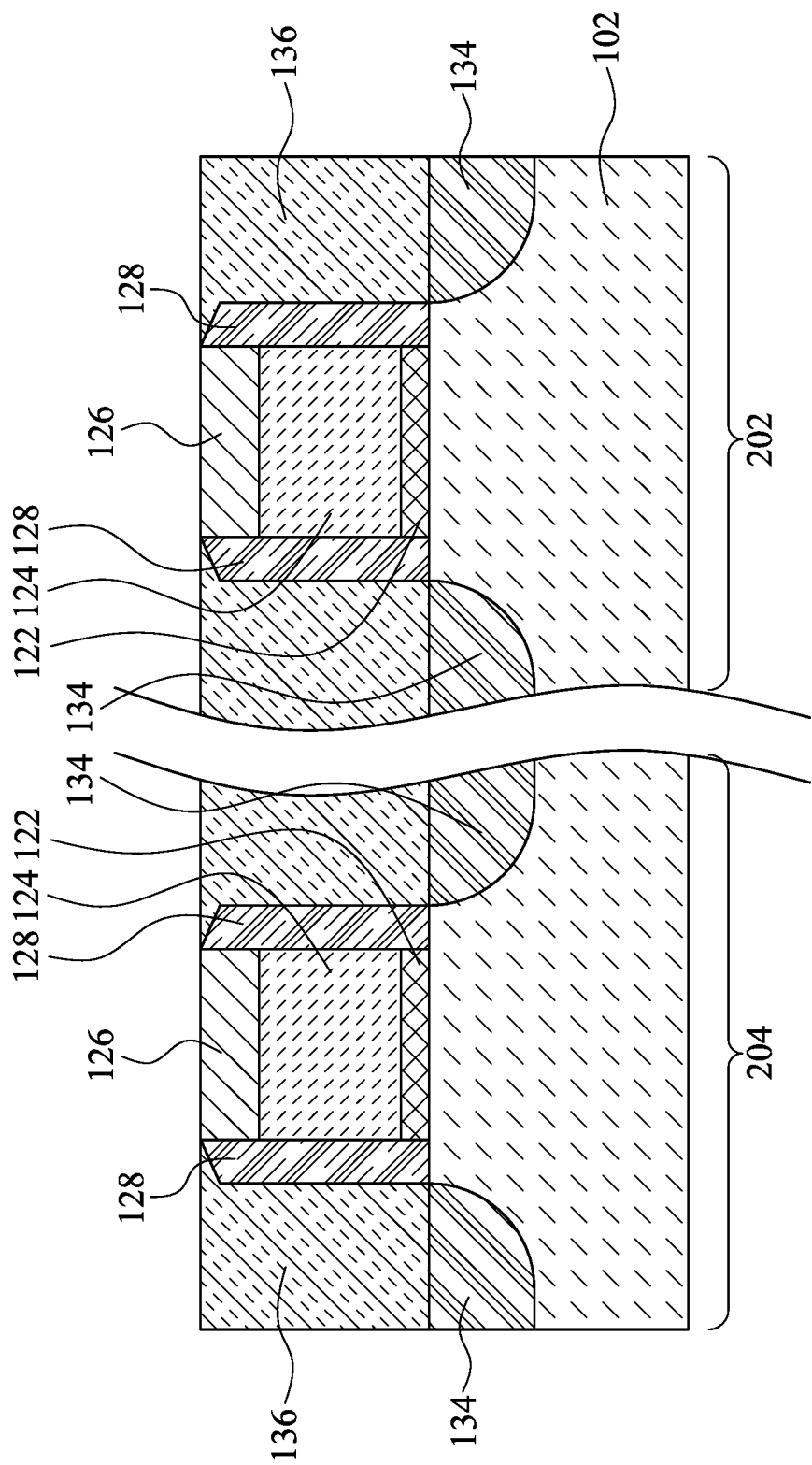

FIGS. 11A through 11C illustrate wafer 100 after interlayer dielectric 136 is formed. ILD 136 may include flowable oxide formed using, for example, flowable chemical vapor deposition (FCVD). A CMP (or other suitable planarization process) may be performed to level the top surfaces of ILD 136, gate stack 120, and gate spacers 128 with each other. Although not shown in detail in FIGS. 11A through 11C, various intermediary layers (e.g., buffer layers and/or etch stop layers) may be disposed between ILD layer 136 and source/drain regions 134, gate stack 120, and/or gate spacers 128.

Figure 12A:
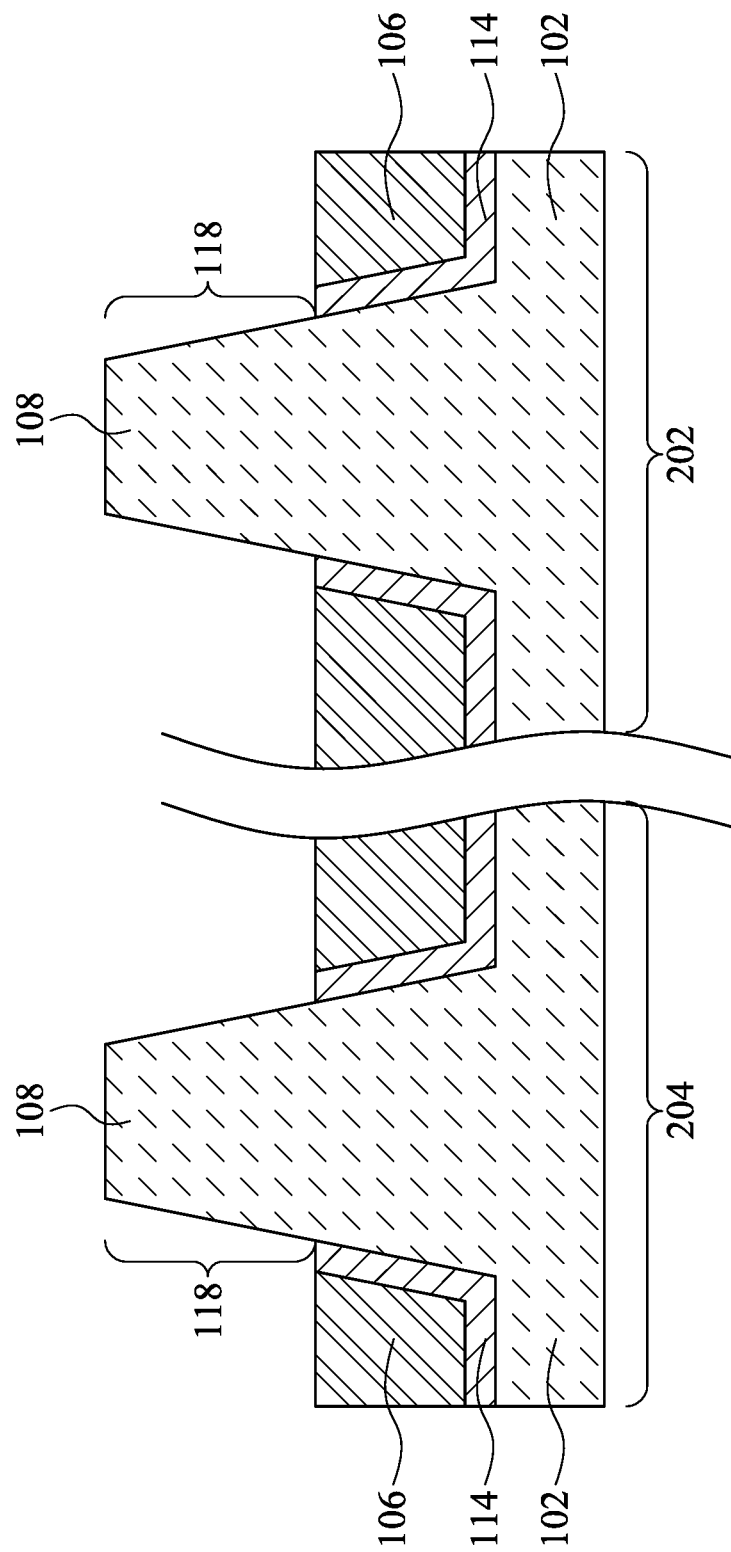
Figure 12B:
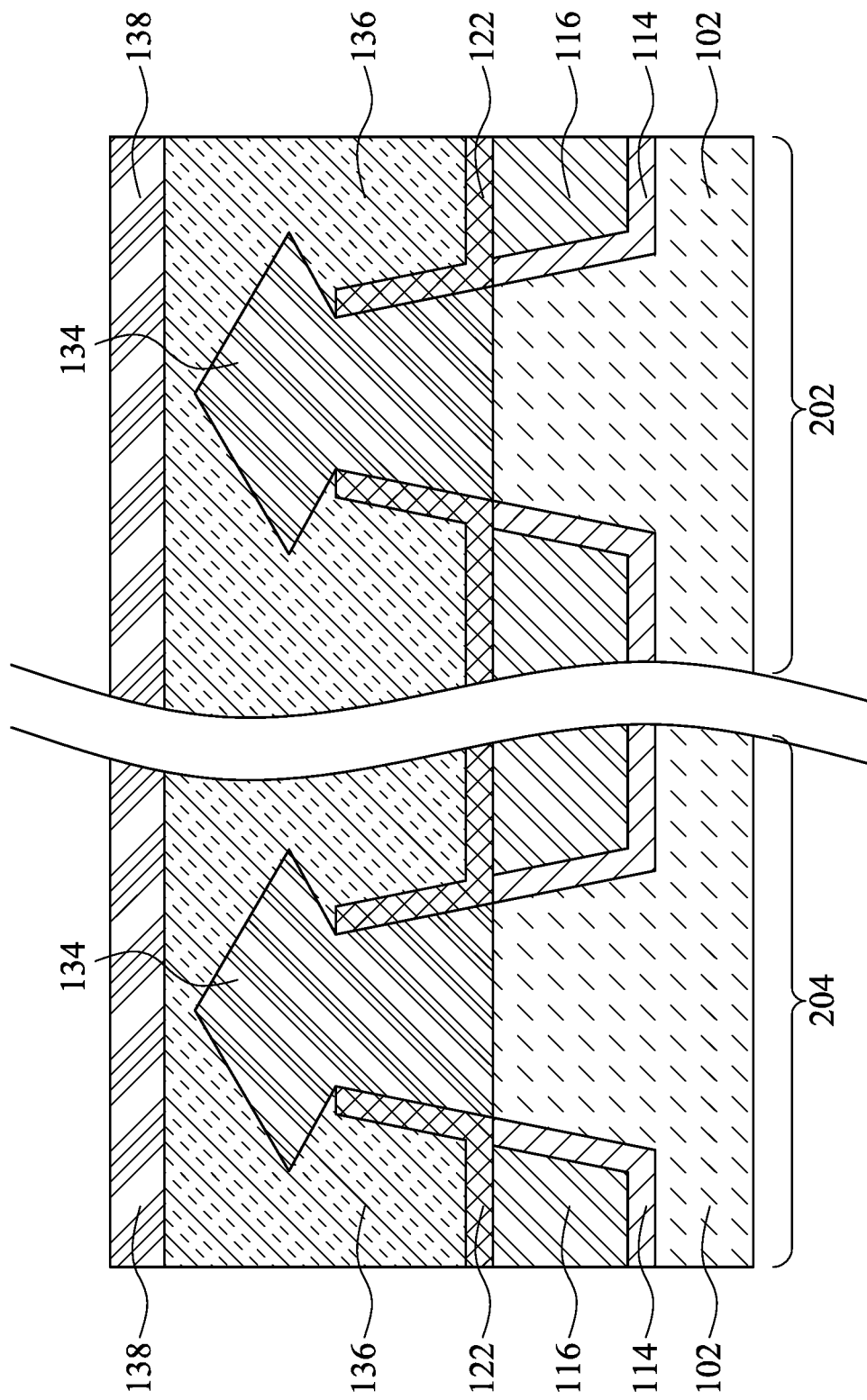
Figure 12C:
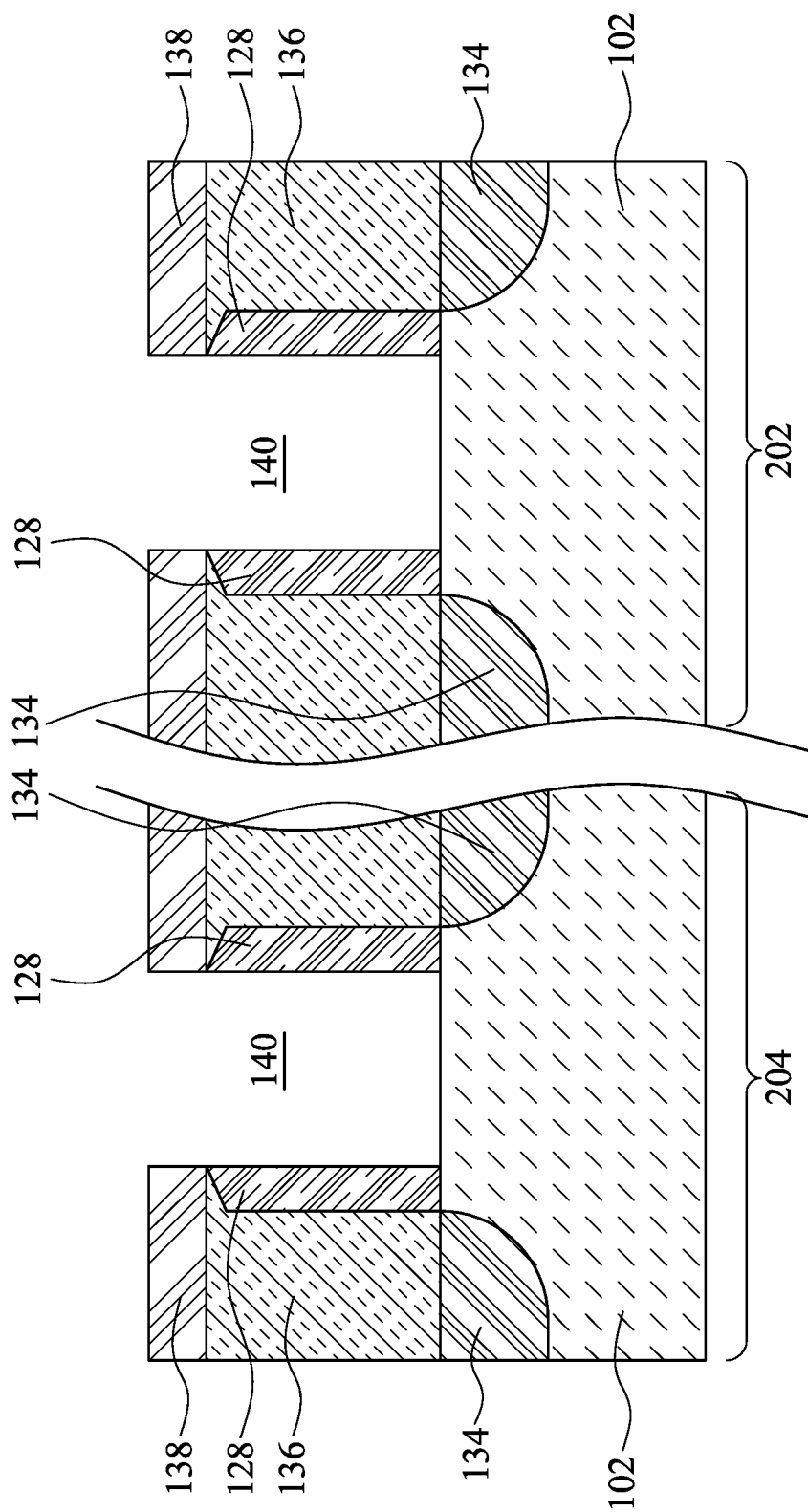

FIGS. 12A through 12C illustrate varying views of wafer 100 after exposing channel regions 118 of fins 108. Exposing channel regions 118 may include removing gate stack 120 (including hard mask 126, dummy gate 124, and dummy oxide 122) from sidewalls and top surfaces of channel regions 118. The removal of gate stack 140 may define trench 140 between gate spacers 128 (see FIG. 12C). A hard mask 128 may be used to mask ILD 136 and source/drain regions 134 during the removal of gate stack 120. Thus, gate stack 120 may be removed without patterning ILD 136 or source/drain regions 134.

FIGS. 13A through 18C illustrate the formation of conformal gate oxides on channel regions 118. As will be explained in greater detail in subsequent paragraphs, a thickness and/or conformity (e.g., maximum thickness variation) of gate oxides may be selected in accordance with an operating voltage of each corresponding finFET device. For example, it has been observed that finFETs having lower operating voltages may benefit from thinner and more conformal gate oxide layers than higher operating voltages finFETs. Thus, in various embodiments the thickness and/or conformity of gate oxide in high-voltage region 202 may be different than the thickness and/or conformity of gate oxide in low voltage region 204.

Figure 13A:
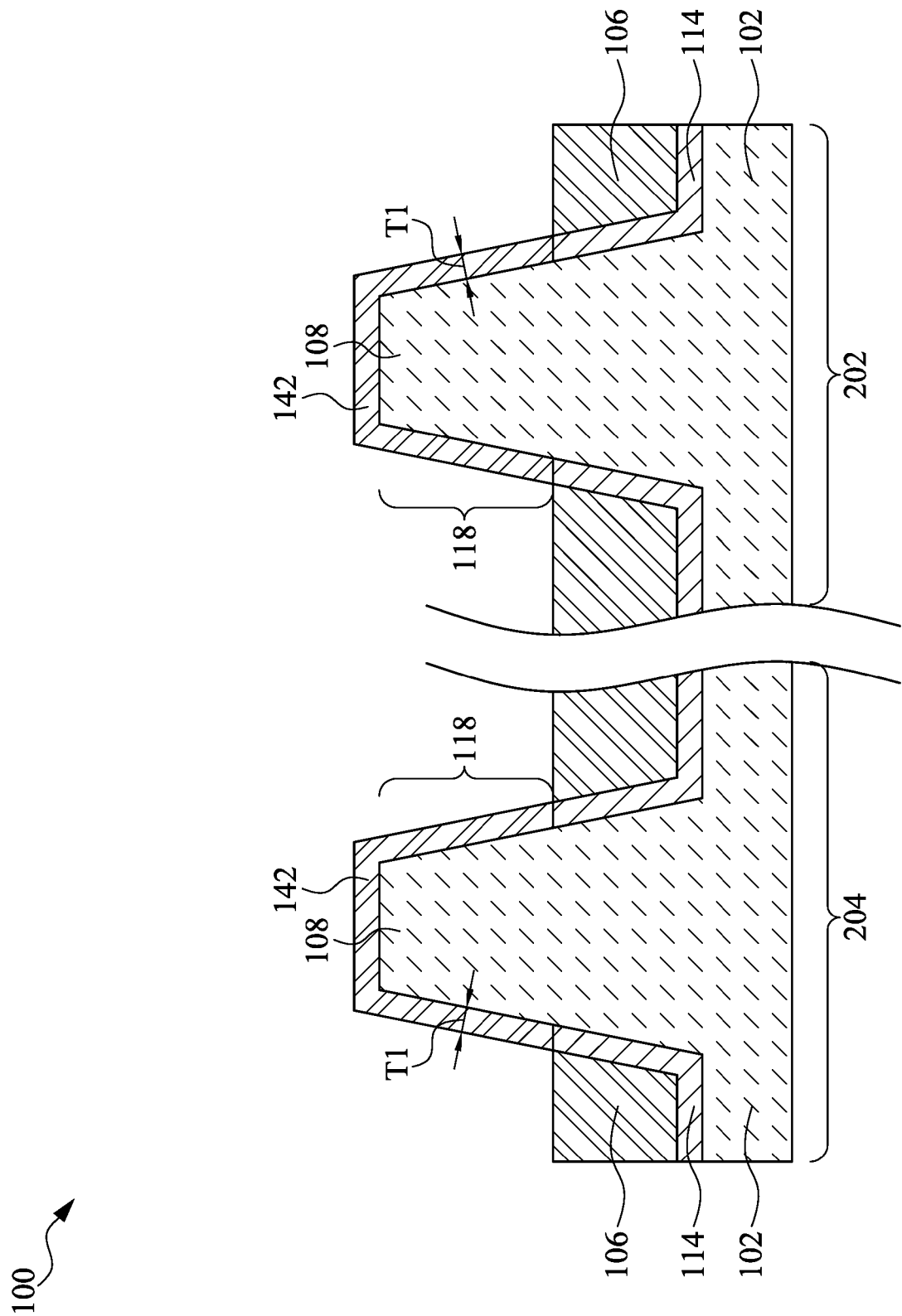
Figure 13B:
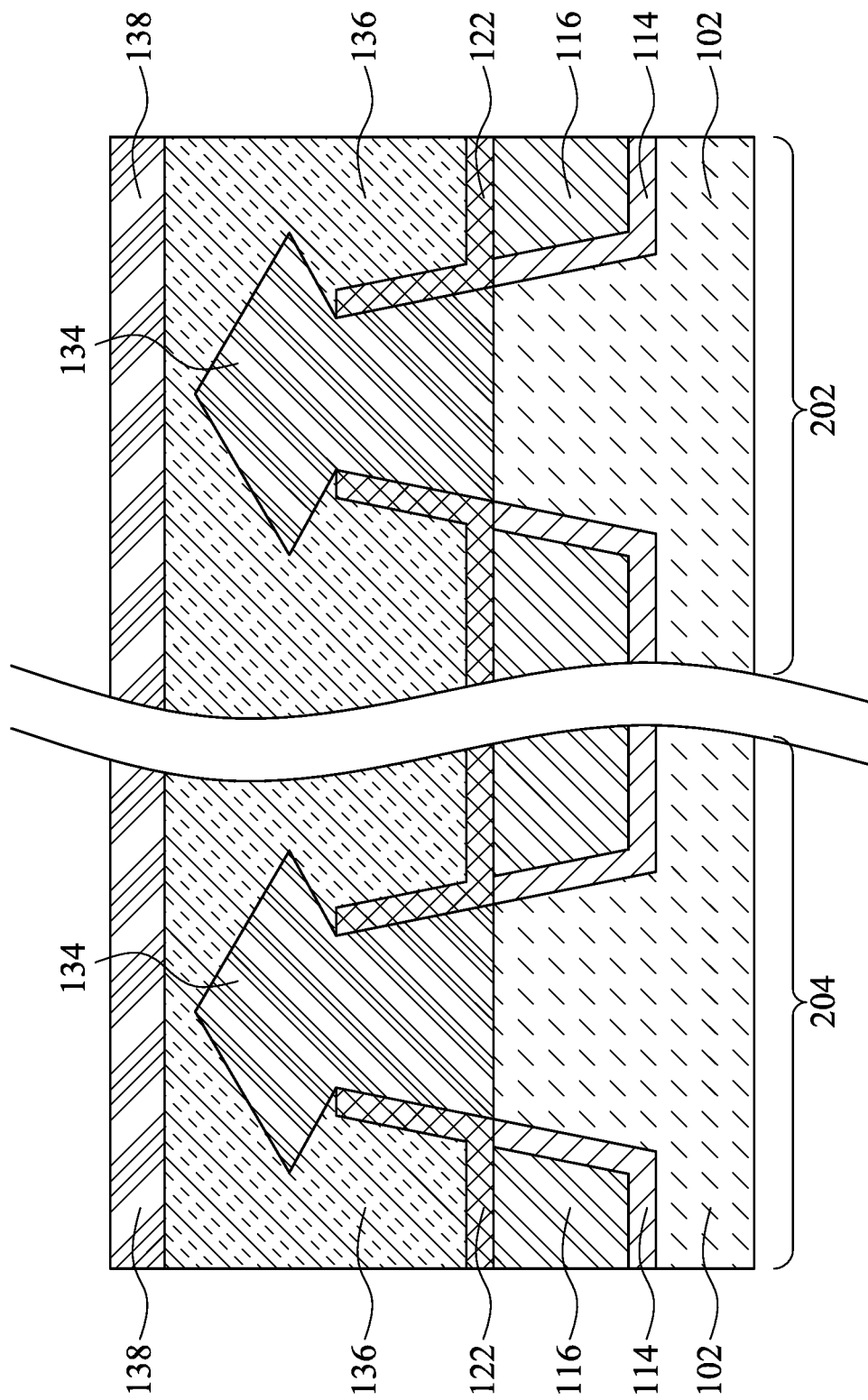
Figure 13C:
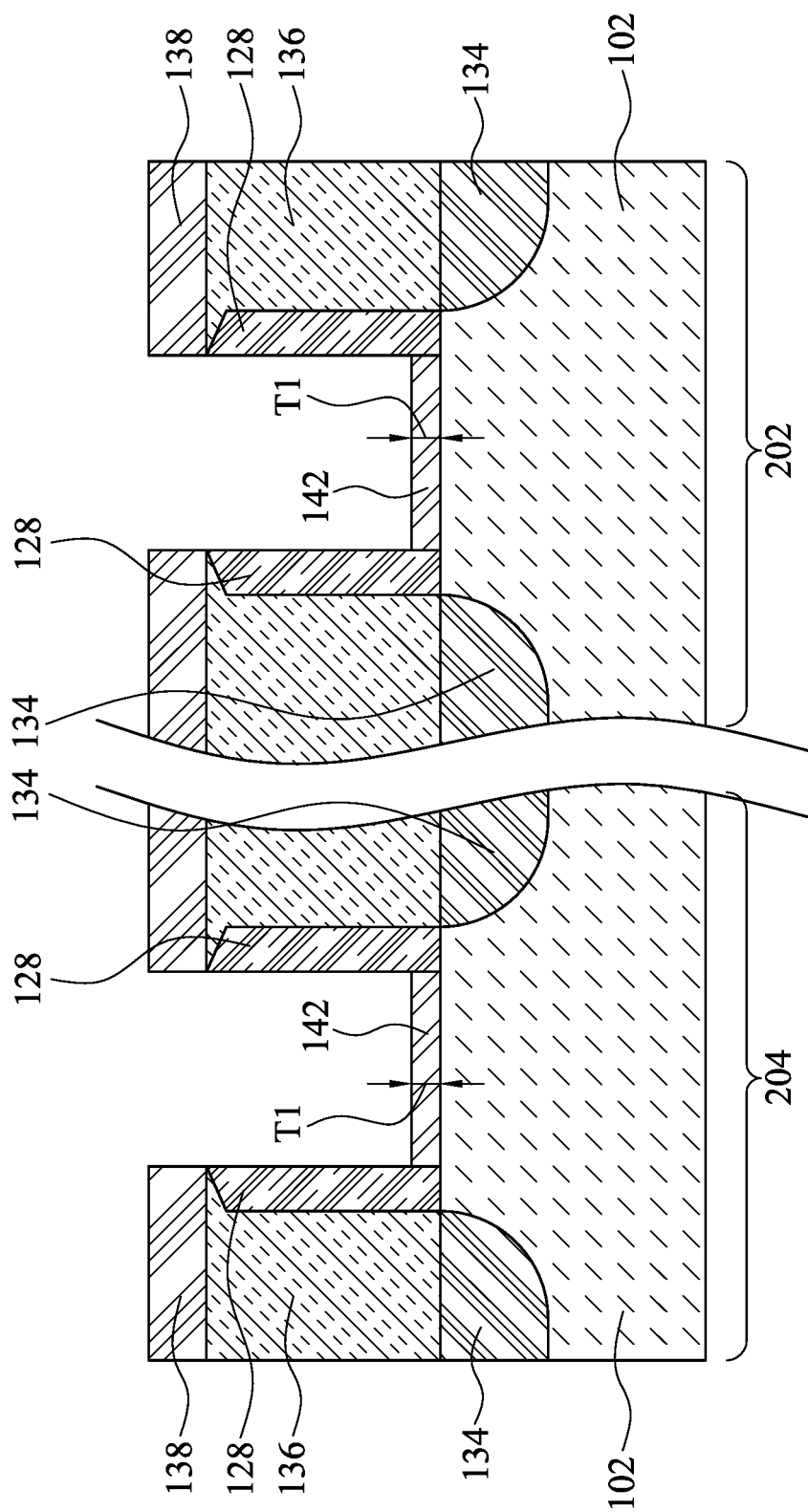

Referring first to FIGS. 13A through 13C, a silicon cap layer 142 is formed on channel regions 118. The formation of silicon cap layer 142 may include performing an epitaxial process on the exposed semiconductor material of channel regions 118, for example. In such embodiments, silicon cap layer 142 may include a silicon oxide (e.g., silicon dioxide, and the like). The resulting silicon cap layer 142 may have a thickness T1 of about 0.5 nm and may contain an atomic percentage of $Si^{4+}$ of about 20%, for example. The epitaxial growth process may selectively form silicon cap layer 142 on exposed semiconductor material of fins 108 without forming silicon cap layer 142 on other surfaces (e.g., STI regions 116 or hard mask 138) of wafer 100.

Figure 14A:
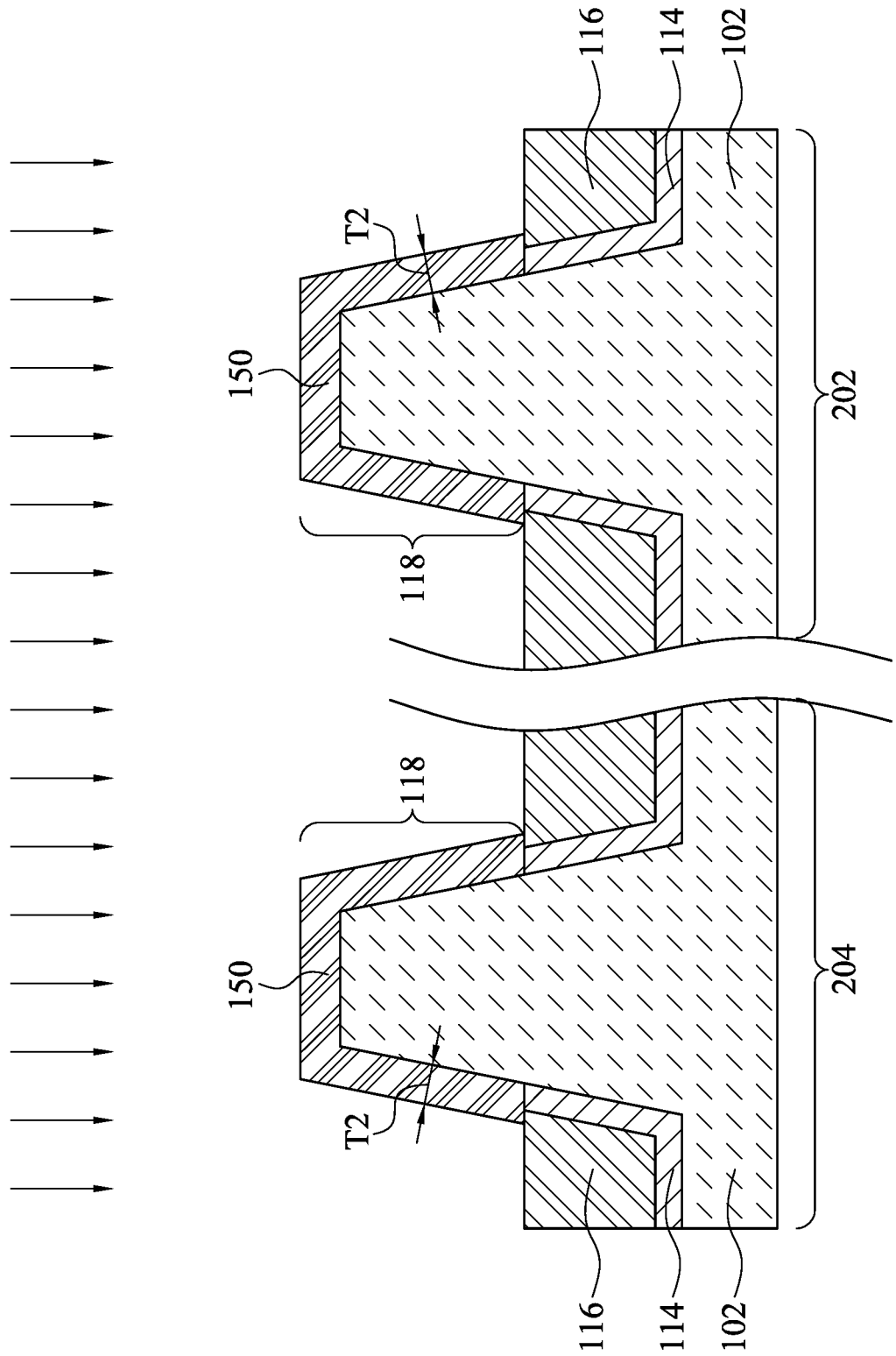
Figure 14B:
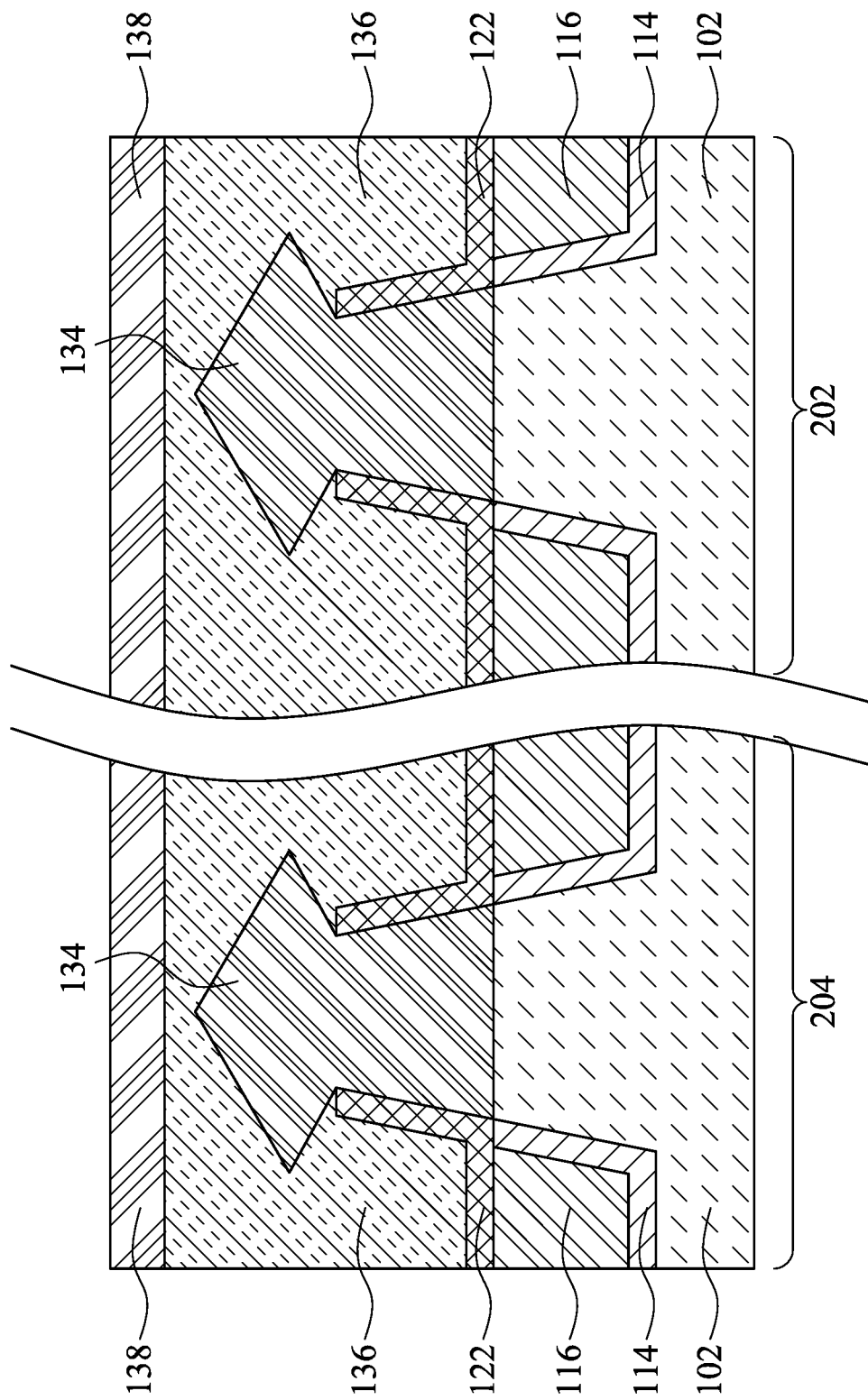
Figure 14C:
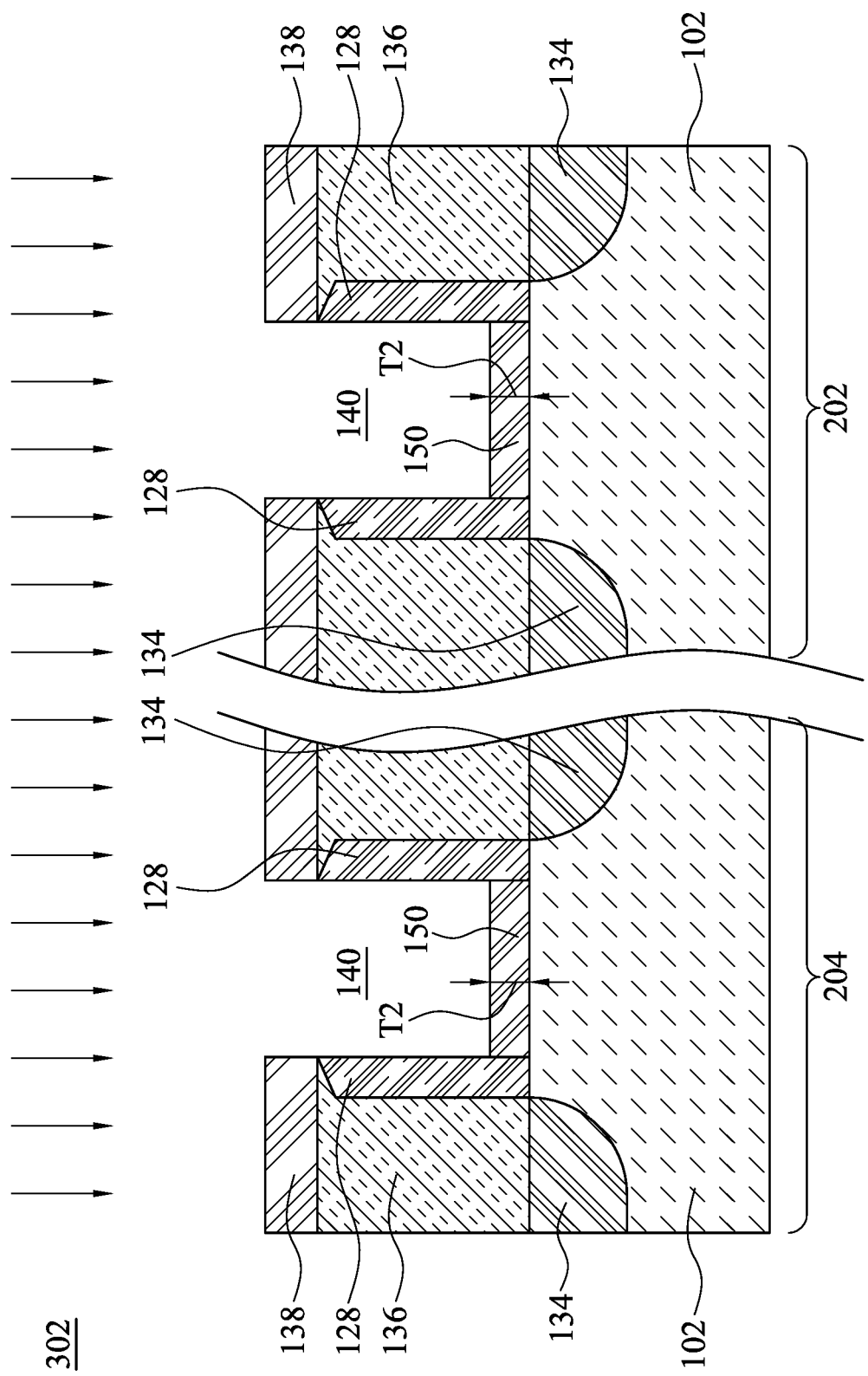

In FIGS. 14A through 14C, a plasma enhanced ALD (PE-ALD) 302 is performed to form a conformal gate oxide 150 on channel regions 118. Gate oxide 150 may be formed by performing any suitable deposition process on the silicon cap layer 142 of channel regions 118. The PE-ALD process 302 converts the silicon cap layer 142 into the gate oxide 150 and increases the thickness the gate oxide 150 by about 3.0 nm. The resulting gate oxide 150 includes silicon dioxide, and the gate oxide 150 has a thickness T2 of about 3.5 nm. As illustrated by FIG. 14A, the resulting gate oxide 150 has thickness T2 on a sidewall of channel region 118. The PE-ALD process 302 may selectively form gate oxide 150 on channel regions 118 without forming gate oxide 150 on other surfaces (e.g., STI regions 116 or hard mask 138) of wafer 100.

Figure 15A:
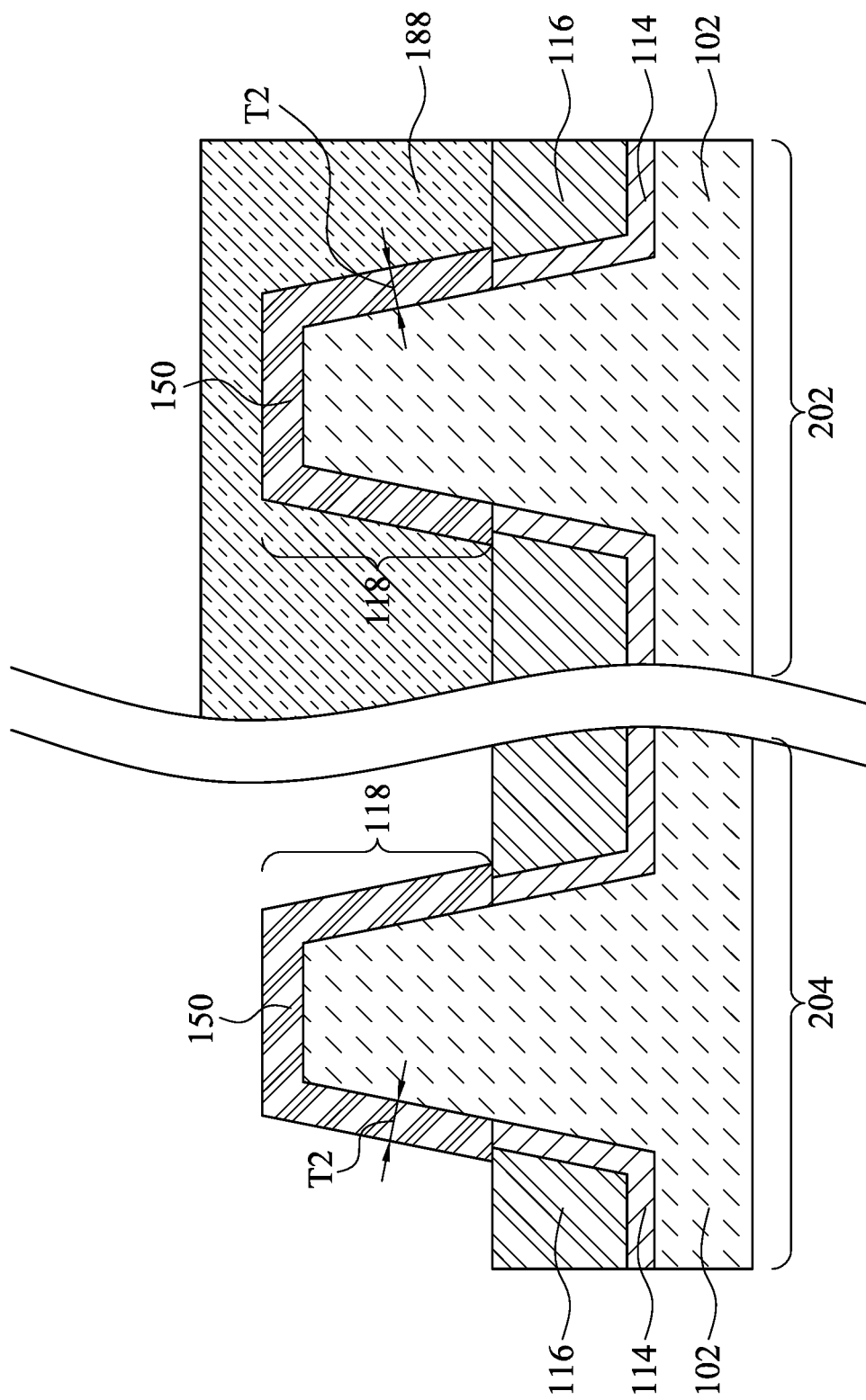
Figure 15B:
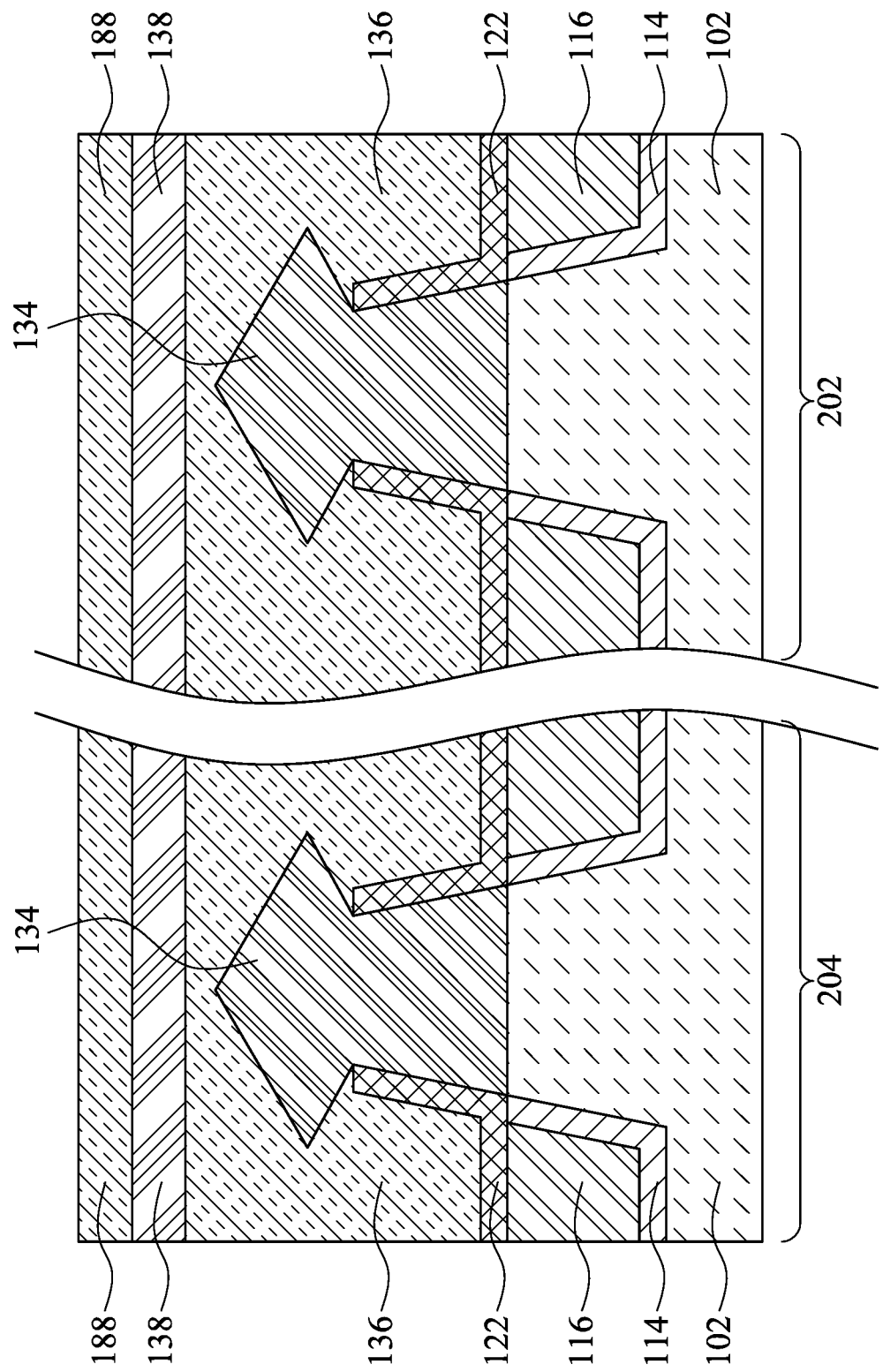
Figure 15C:
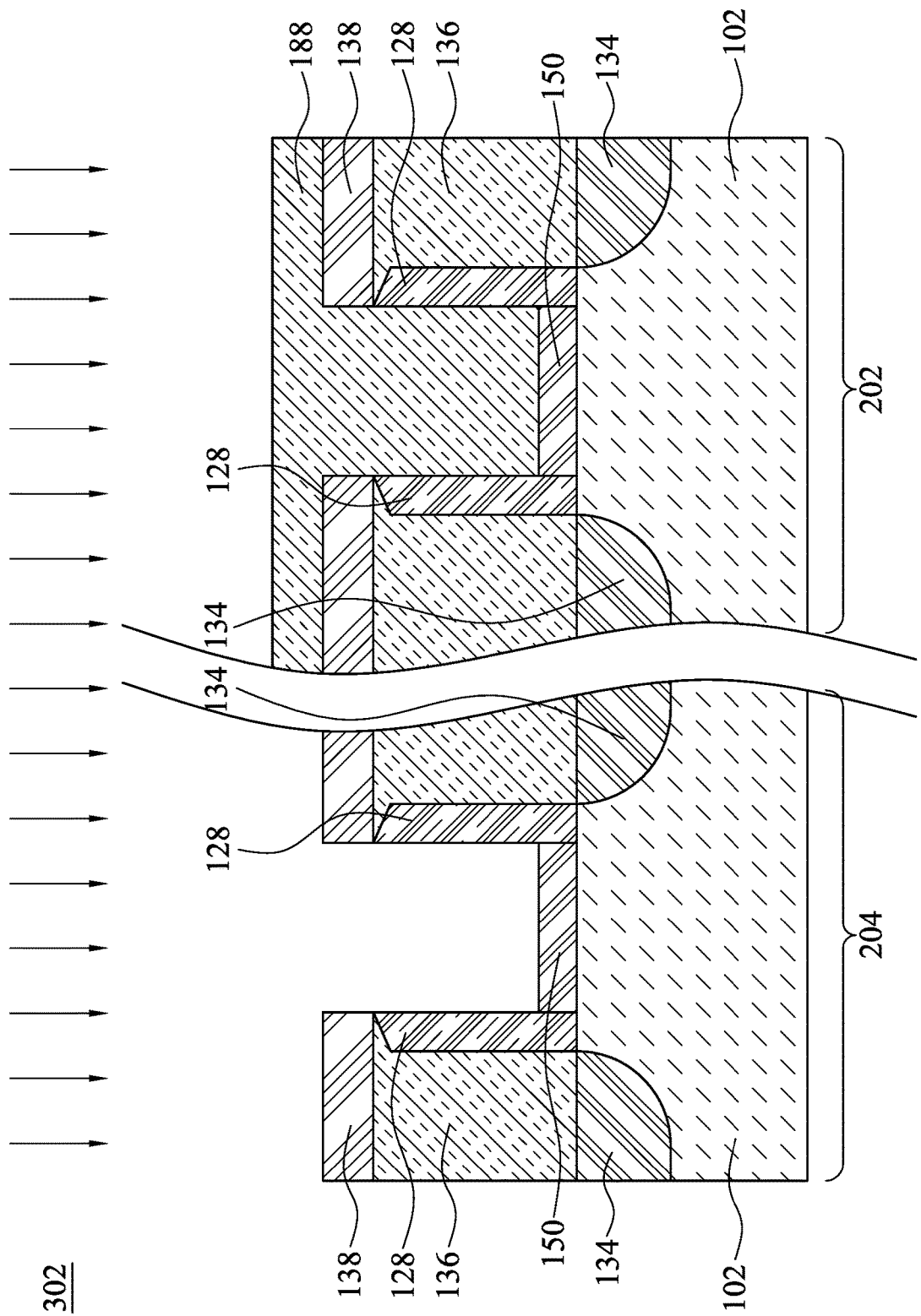

Because the operating voltage of devices in high-voltage region 202 and low voltage region 204 may differ, it may be desirable to form a thinner and more uniform gate oxide in low voltage region 204. FIGS. 15A through 18C illustrate the formation of an interfacial layer 170 on channel region 118 in low voltage region 204. Referring first to FIGS. 15A through 15C, a mask layer (photoresist layer) 188 is deposited on the high voltage region 202. The low voltage region 204 is exposed, and the gate oxide 150 is exposed on sidewalls of channel region 118 and from the space between gate spacers 128.

Figure 16A:
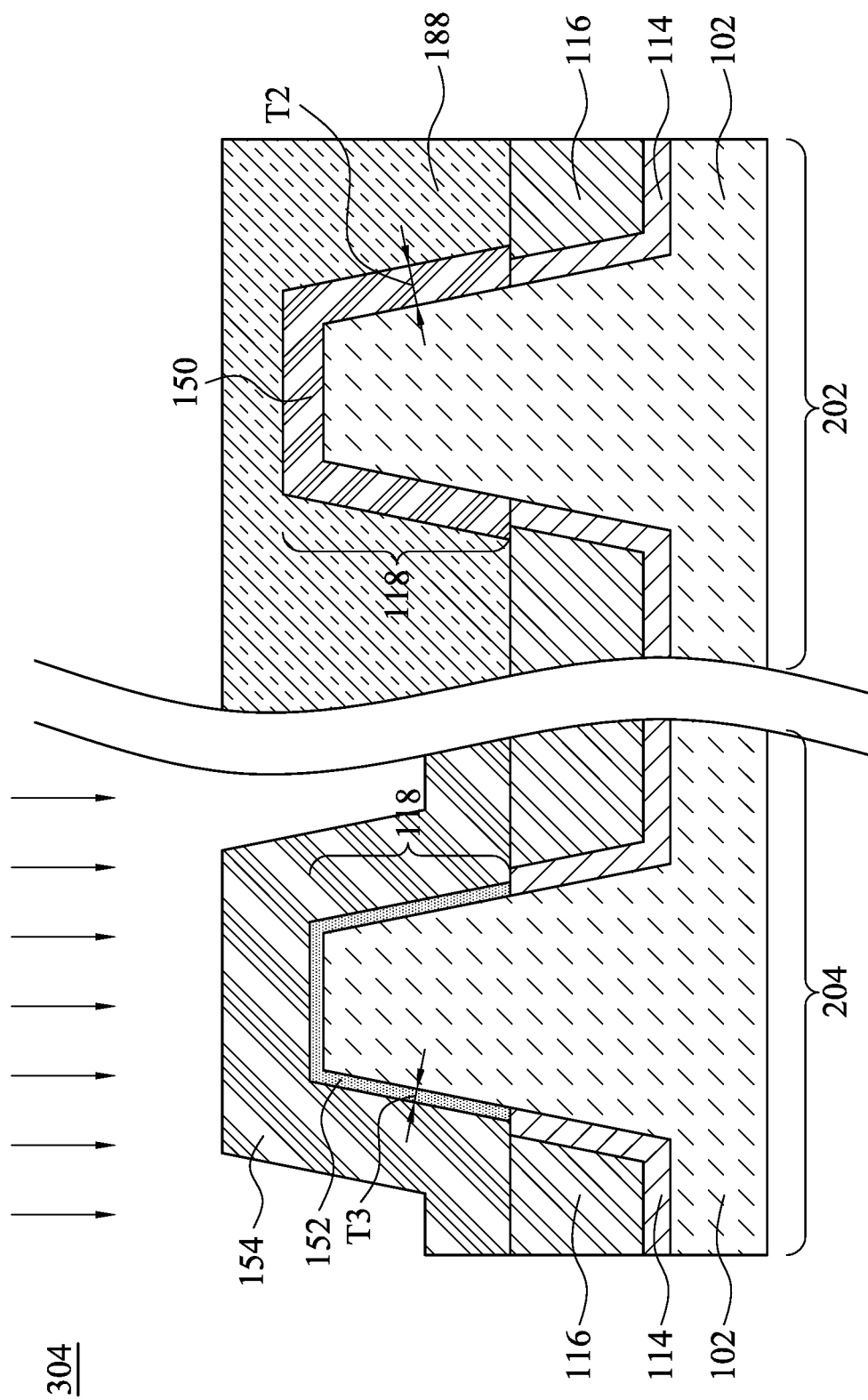
Figure 16B:
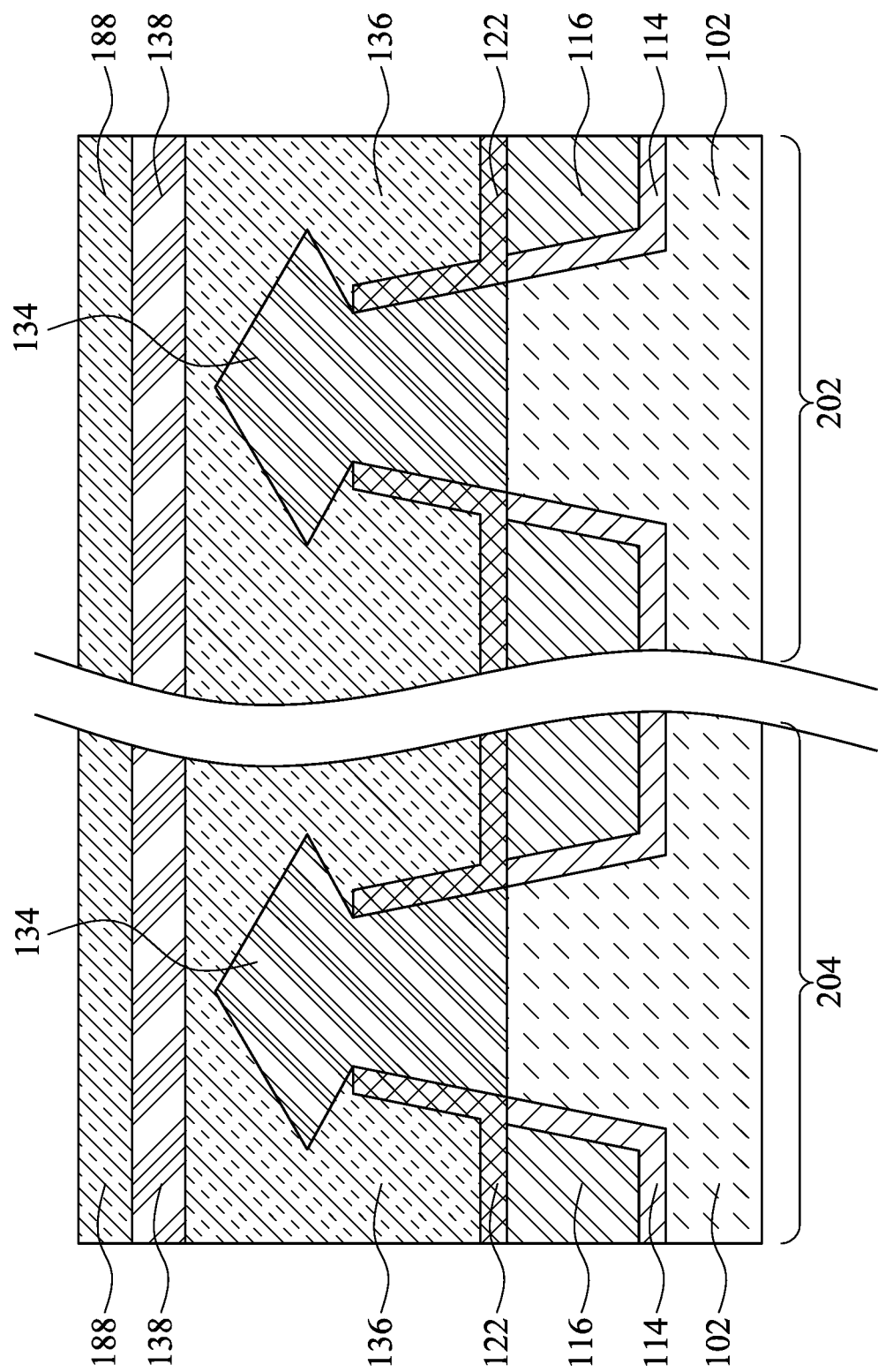
Figure 16C:
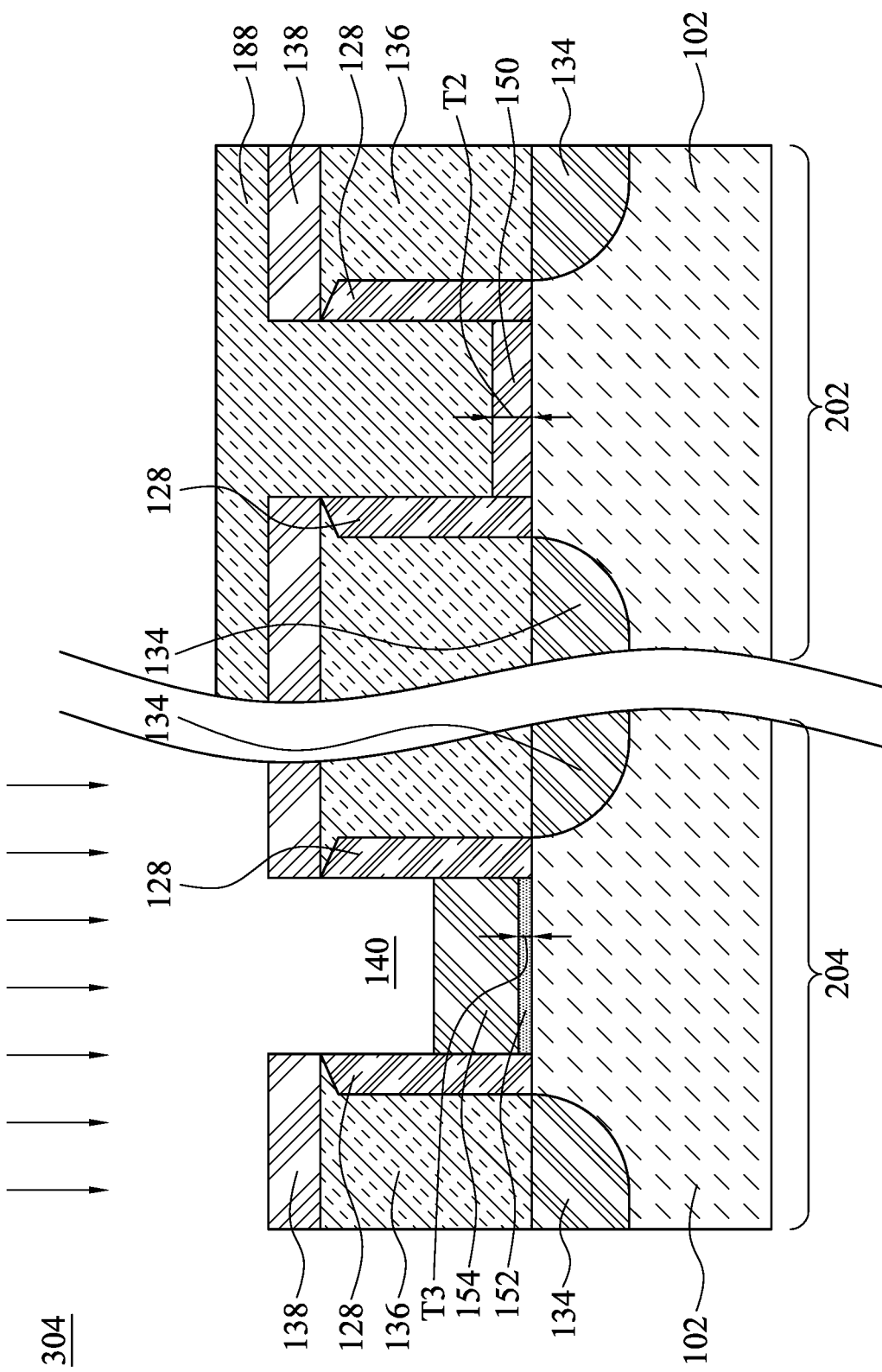

In FIGS. 16A through 16C, nitrogen containing agent 304 is used to treat the low voltage region 204. A nitrogen containing agent 304 is supplied to the channel region 118 at a temperature of about between 20 and 60° C. The nitrogen containing agent 304 may be a combination of $NF_3$ and $NH_3$ or HF and $NH_3$. When the nitrogen containing agent 304 is supplied, it may be in gas phase or in plasma phase and through a carrier gas like Ar or $N_2$. Under the low temperature, the gate oxide 150, which includes silicon dioxide, is converted to ammonium hexafluorosilicate (($NH_4)_2SiF_6$, AHFS) through the following reactions:

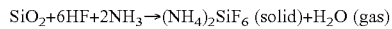

The nitrogen containing agent 304 reacts with the gate oxide 150 and converted a bottom portion of the gate oxide 150 into $Si^{4+}$ rich interfacial layer 152 at the interface between the channel region 118 and the gate oxide 150. The resulting interfacial layer 152 has a thickness T3 of about 0.3 nm and an atomic percentage of $Si^{4+}$ of about 77%, for example. In addition to the conversion to $Si^{4+}$ rich interfacial layer, an upper portion of the gate oxide 150 is converted into AHFS layer 154. AHFS layer 154 is solid substance overlying the newly converted interfacial layer 152. The thickness of the AHFS layer 154 may be finely tuned by controlling gas flow ratio, pressure, and/or bias power. The volume of AHFS layer 154 is greater than the initial gate oxide 150 because of the molecular structure of AHFS, ammonium hexafluorosilicate (($NH_4)_2SiF_6$, AHFS). The high voltage region 202 is under the protection of mask layer 188 and the nitrogen containing agent 304 does not convert the gate oxide 150 on the high voltage region 202.

Figure 17A:
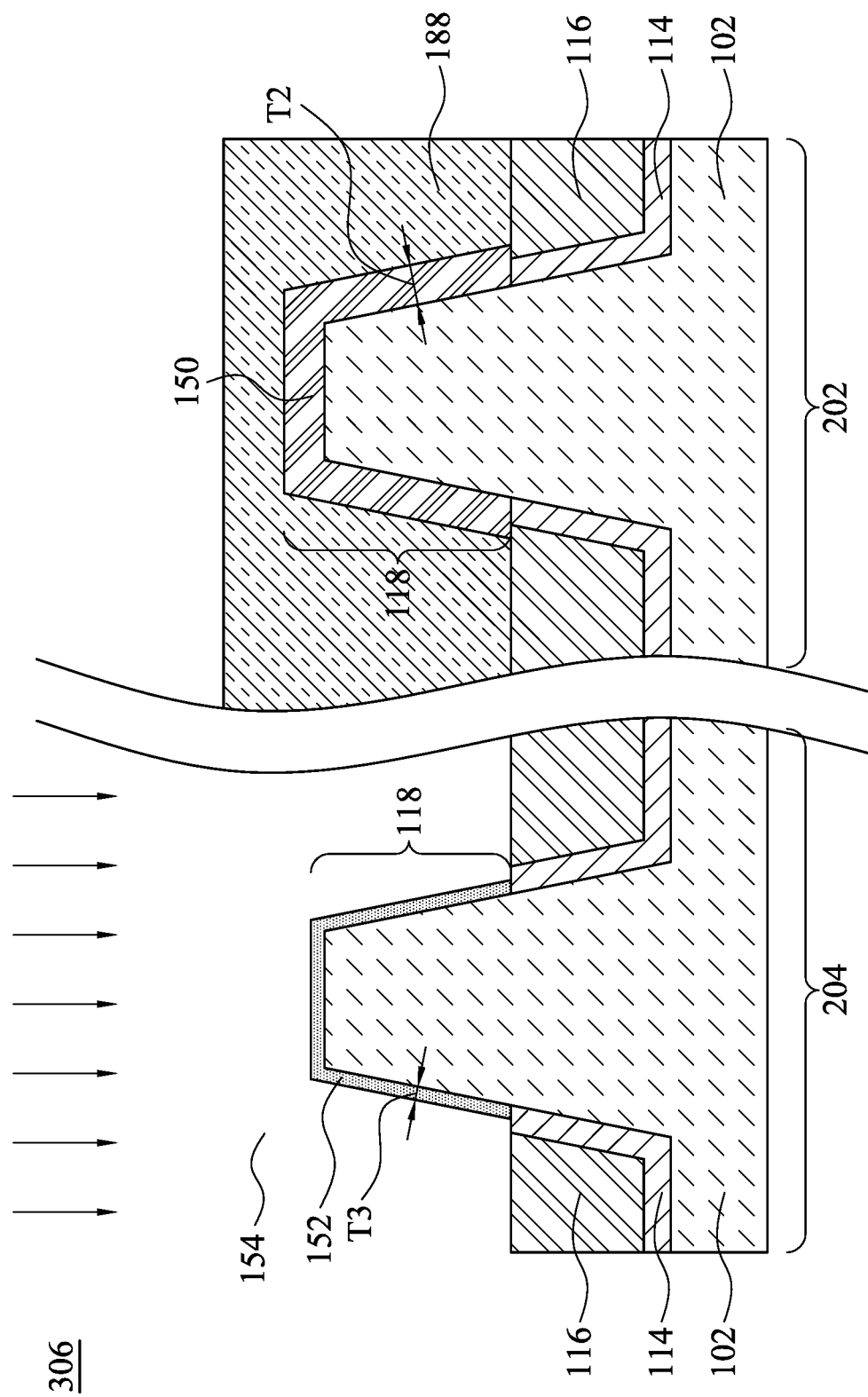
Figure 17B:
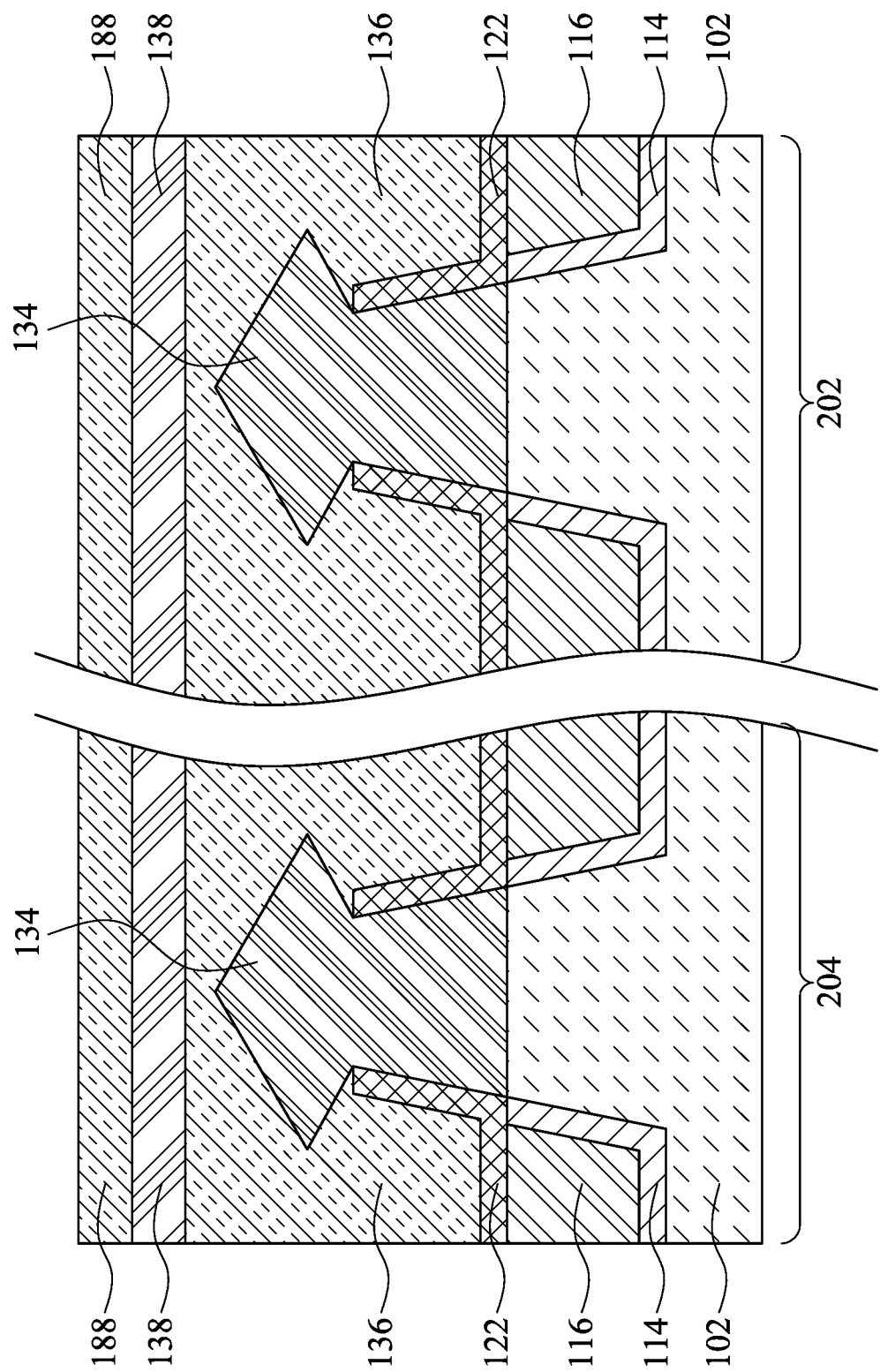
Figure 17C:
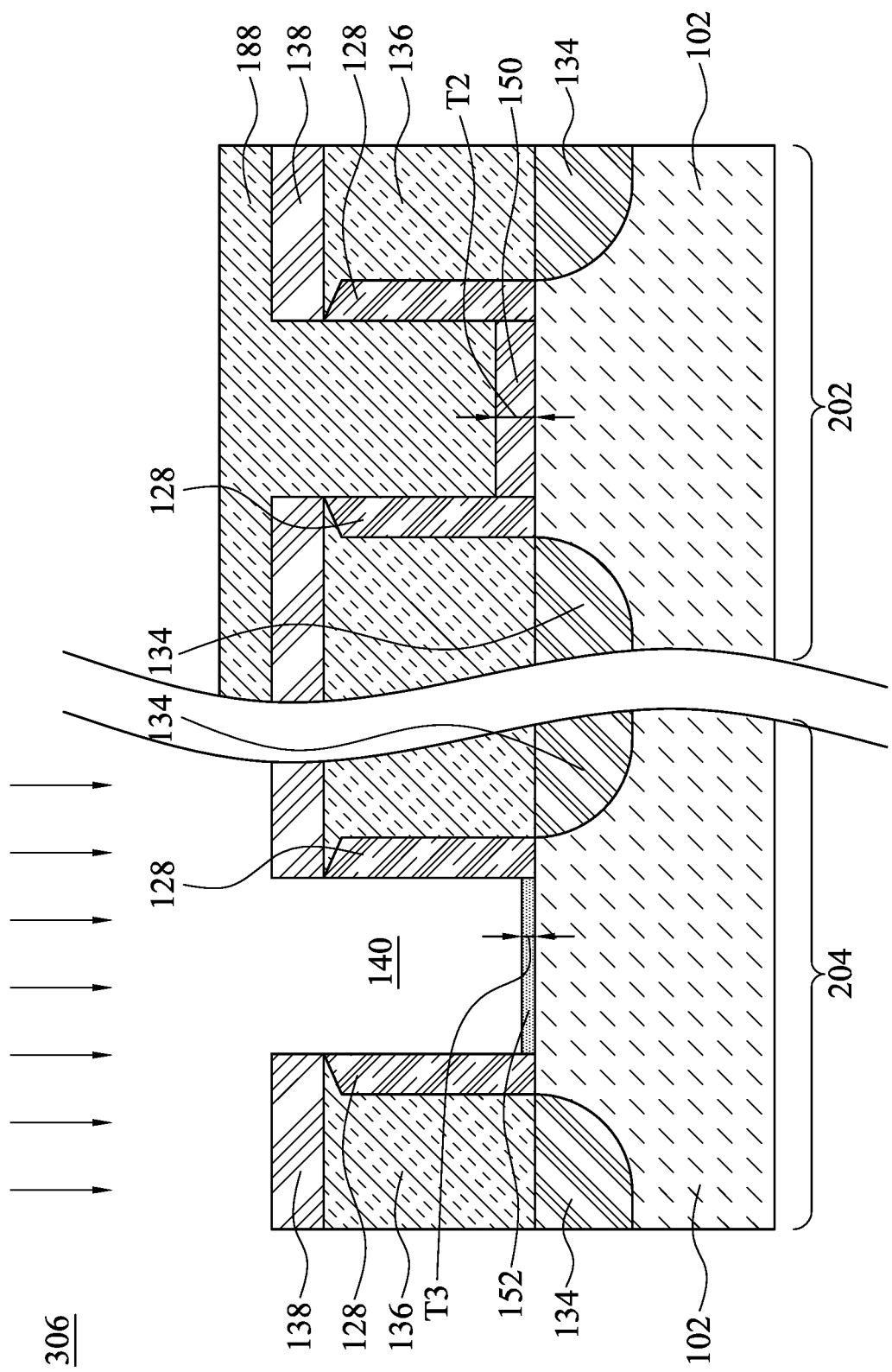

In FIGS. 17A through 17C, AHFS layer 154 is removed. AHFS layer 154 has a solubility in deionized water ($H_2O$) of about 1.27 mol/l. That is, AHFS layer 154 is highly soluble in water in comparison with the $Si^{4+}$ rich interfacial layer 152. A clear cut-off interface is present between the AHFS layer 154 and interfacial layer 152 because of different chemical composition. Due to the solubility, AHFS layer 154 may be removed by rinsing the semiconductor substrate 102 with deionized water 306 at a temperature of between about 20 and 80° C. In some embodiments, room temperature is suitable for the rinsing process. The AHFS layer 154 is removed according to the following chemical reaction:

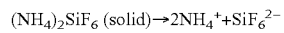

When AHFS layer 154 is washed away, the interfacial layer 152 remains on the channel region 118. The removal of AHFS layer 154 has nearly none (<0.01 atomic percentage) fluoride (F) residue left behind. The surface of interfacial layer 152 will not be damaged by chemicals or put through high temperature environment that is often used in conventional etching process. This mild AHFS layer removal process results in a very thin and pin hole free interfacial layer 152. The interfacial layer 152 and the gate oxide 150 of high voltage region 202 may both include silicon dioxide, while the interfacial layer 152 is thinner than the gate oxide 150 and has a higher stoichiometry in terms of $O/SiO_x$. The interfacial layer 152 has an $O/SiO_x$ of about 1.9, which is very close to the idea value 2.

The mask layer 188 is then removed by ozone in deionized water, for example. Mask layer removal may be followed by a cleaning process and a hydrophilication process. The channel region 118 of high voltage region 202 and low voltage region 204 are under coverage of the gate oxide 150 and interfacial layer 152, respectively such that the underlying channel region 118 is not exposed during mask layer 188 removal.

Figure 18A:
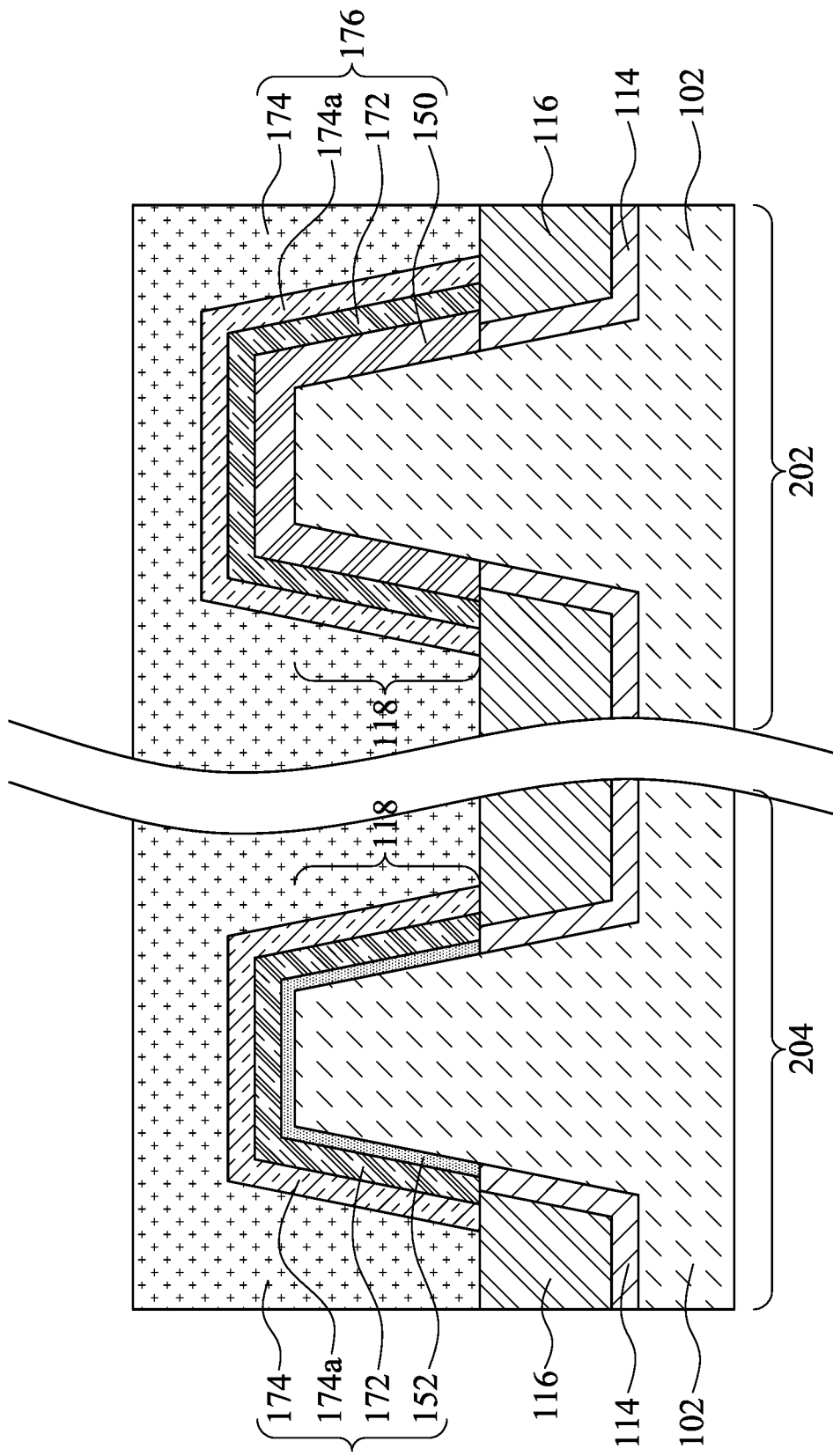
Figure 18B:
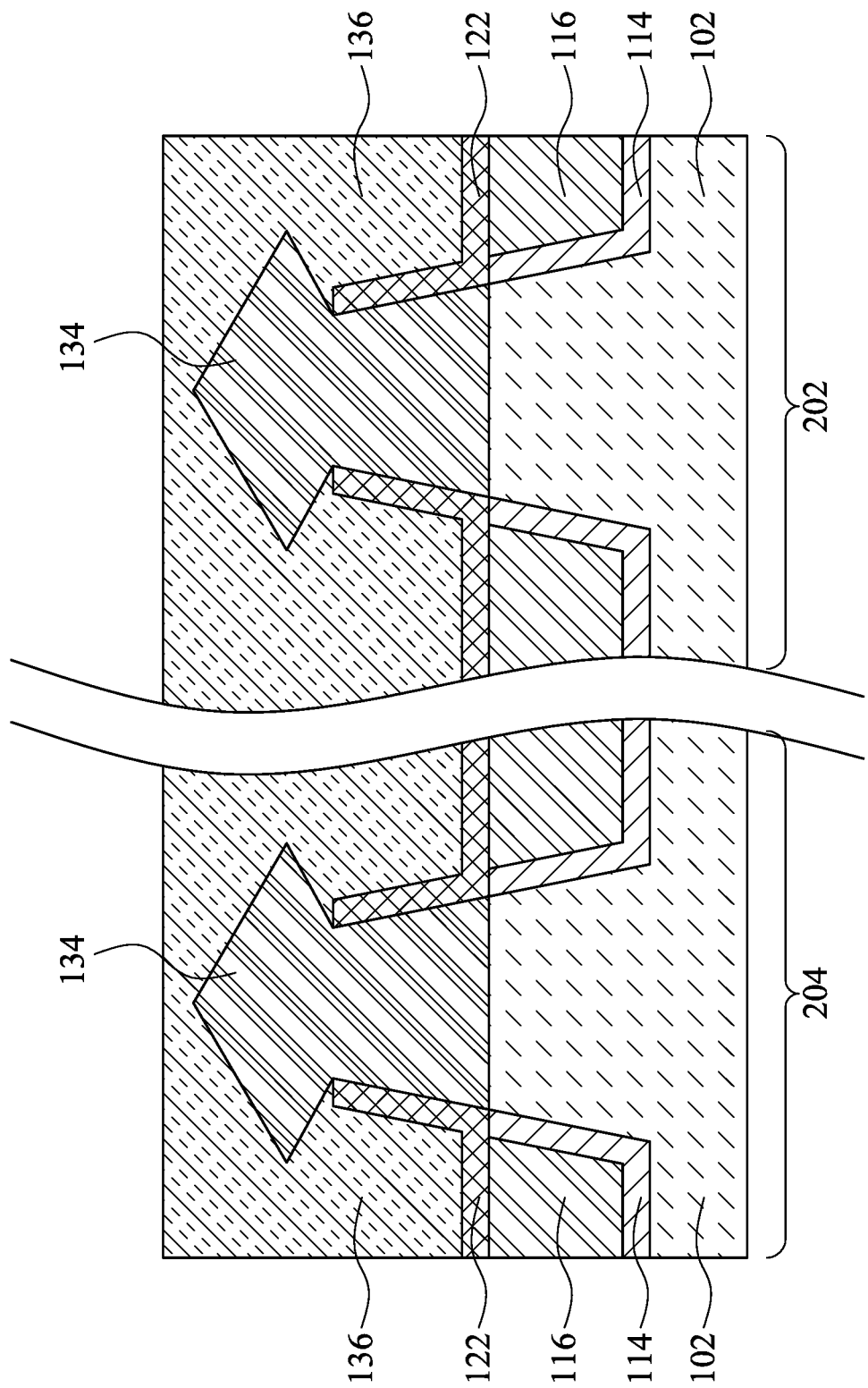
Figure 18C:
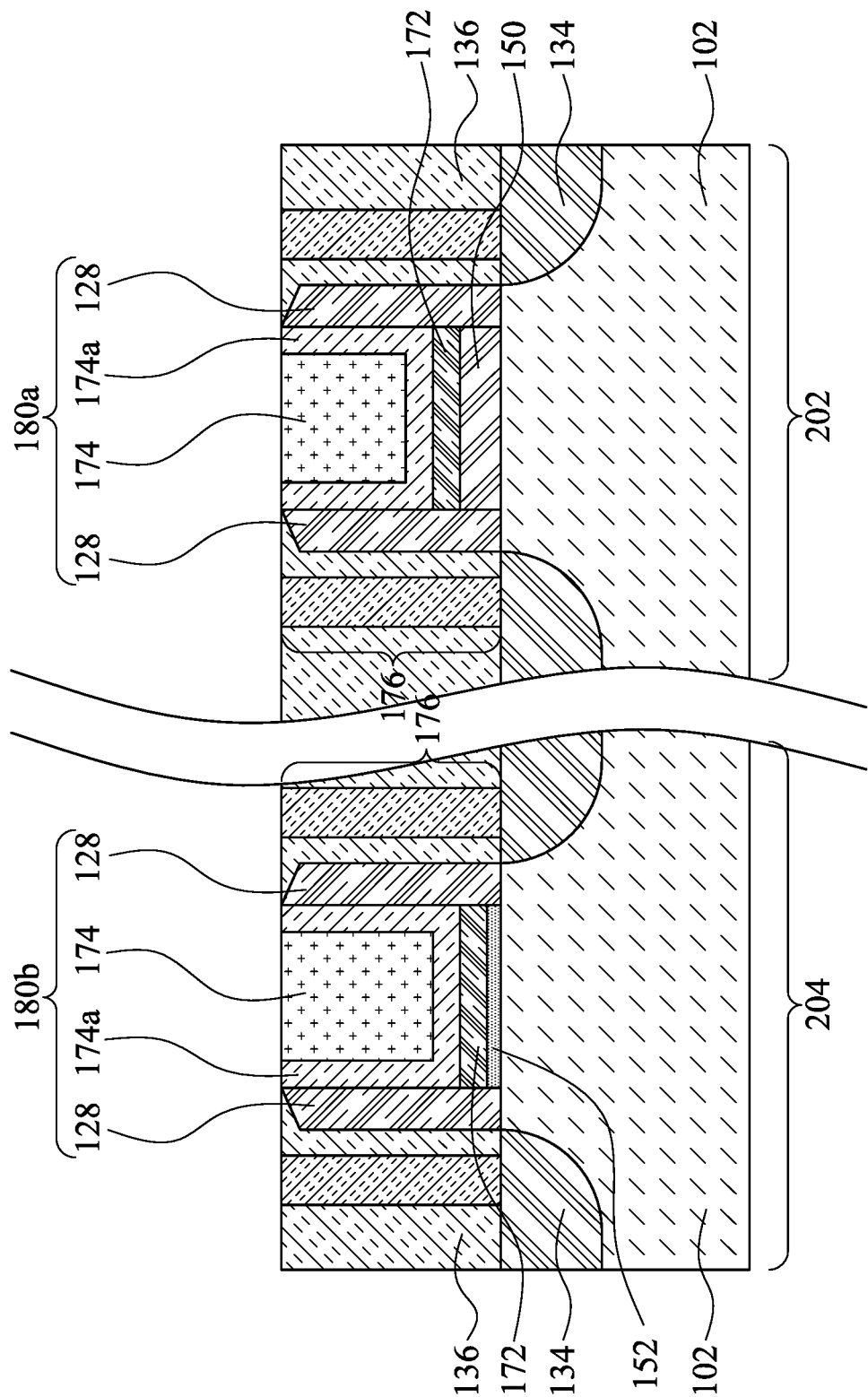

In FIGS. 18A through 18C, remaining portions of gate stack 176 is formed in trenches 140 (e.g., between gate spacers 128). A high-k dielectric layer 172 is formed in trenches 140. High-k dielectric layer 172 may cover top surfaces and the sidewalls of interfacial layer 152 and/or gate oxide 150 (see FIG. 18A). The interfacial layer 152 contains $Si^{4+}$ rich $SiO_2$, and the high-k dielectric layer 172 is easier to form on the interfacial layer 152. In some embodiments, high-k dielectric layer 172 includes a high-k dielectric material having k value greater than about 7.0, and may include a metal oxide or a silicate of hafnium (Hf), aluminum (Al), zirconium (Zr), lanthanum (La), magnesium (Mg), barium (Ba), titanium (Ti), lead (Pb), combinations thereof, and the like. The formation methods of high-k dielectric layer 172 may include molecular beam deposition (MBD), ALD, plasma enhanced CVD (PECVD), or the like.

Next, a conductive gate electrode 174 is formed over high-k dielectric layer 172 by filling remaining portions of trenches 140 with a conductive material. Gate electrode 174 may include a metal-containing material such as titanium nitride (TiN), tantalum nitride (TaN), tantalum carbon (TaC), cobalt (Co), ruthenium (Ru), aluminum (Al), combinations thereof, multi-layers thereof, and the like. A barrier layer 174a may be formed before the deposition of gate electrode 174. In some embodiments, the barrier layer 174a is formed as a conformal layer in trenches 140. The formation of high-k dielectric layer 172, barrier layer 174a, and gate electrode 174 may overflow trenches 140 and cover a top surface of ILD 136. Subsequently, a planarization (e.g., a CMP) is performed to remove the excess portions of high-k dielectric layer 172, barrier layer 174a, and gate electrode 174. The resulting remaining portions of gate oxide 150, interfacial layer 152, high-k dielectric layer 172, and gate electrode 174 forms a gate stack 176 over a channel region 118 of the resulting finFET 180a in high voltage region 202 and finFET 180b in low voltage region 204. Additional features, such as source/drain contacts 178, for example, comprising nickel (Ni), tungsten (W), or the like may then be formed on ILD 136 using any suitable process to electrically connect with source/drain regions 134.

The overall thickness of gate stack 176 is substantially the same, while the layers that constitute finFET 180a and finFET 180b have different thickness. The finFET 108a in high voltage region 202 has a thick gate oxide 150 that is at least six times thicker than the interfacial layer 152 of the finFET 180b in low voltage region 204. This thin and $Si^{4+}$ rich interfacial layer 152 ensures the subsequent high-k dielectric layer 172 to be uniform without pin hole.

The process of converting existing gate oxide into AHFS layer and $Si^{4+}$ rich layer may also be applied to an etch back process, for example. The AFHS layer can be removed by rinsing the substrate with deionized water, and the resulting silicon dioxide layer is pin-hole free and high in stoichiometry ($O/SiO_x$) to nearly 2.

In some embodiments, a method of fabricating a semiconductor device includes forming a semiconductor fin comprising a channel region for a fin field effect transistor (finFET). A gate oxide layer is then formed on the channel. The gate oxide layer is treated with a nitrogen containing agent so as to form a nitrogenous layer and an interfacial layer. The nitrogenous layer is then removed. A high-k dielectric layer is formed on the interfacial layer. A metal gate is formed on the high-k dielectric layer.

In some embodiments, a method of fabricating a semiconductor device includes forming first and second semiconductor fins, each of the first and second semiconductor fins. The first and second semiconductor fins include a first channel region and a second channel region for a first fin field effect transistor (finFET) and a second finFET respectively. A gate oxide layer is formed on the first channel and second channel. The gate oxide layer on the first channel is treated with a nitrogen containing agent so as to form a water soluble layer and an interfacial layer on the first channel. The water soluble layer is then removed. A high-k dielectric layer is formed on the interfacial layer. A metal gate is formed on the high-k dielectric layer.

In some embodiments, a semiconductor device includes a first semiconductor fin having a first channel region, a second semiconductor fin comprising a second channel region, an interfacial layer on the first channel region. A gate oxide layer is disposed on the second channel region, wherein the interfacial layer has a $Si^{4+}$ ion concentration greater than the gate oxide layer. A high-k dielectric layer is disposed on the interfacial layer and the gate oxide layer. A metal gate is disposed on the high-k dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
    forming a first semiconductor fin comprising a first channel region for a first fin field effect transistor (finFET) and a second semiconductor fin comprising a second channel region for a second finFET;
    forming a first gate oxide layer on the first channel region and a second gate oxide layer on the second channel region;
    treating the first gate oxide layer with a nitrogen containing agent so as to convert a surface portion of the first gate oxide layer into a nitrogenous layer wherein the remaining portion of the first gate oxide layer is called an interfacial layer, and the second gate oxide layer is not treated;
    removing the nitrogenous layer from a surface of the interfacial layer;
    forming a high-k dielectric layer directly over the surface of the interfacial layer after the nitrogenous layer is removed; and
    forming a metal gate on the high-k dielectric layer.

2. The method of claim 1, wherein the removing the nitrogenous layer comprises:
    rinsing the first semiconductor fin with deionized water.

3. The method of claim 1, wherein the forming the first gate oxide layer on the first channel region and the second gate oxide layer on the second channel region comprises:
    epitaxially growing a plurality of silicon cap layers on the first semiconductor fin and the second semiconductor fin.

4. The method of claim 3, wherein the forming the first gate oxide layer on the first channel region and the second gate oxide layer on the second channel region comprises:
    treating the silicon cap layers with ozone and deionized water; and
    performing an atomic layer deposition (ALD) with a gate oxide material.

5. The method of claim 1, wherein the treating the first gate oxide layer with the nitrogen containing agent comprises:
    introducing gas phase nitrogen containing agent.

6. The method of claim 1, wherein the treating the first gate oxide layer with the nitrogen containing agent comprises:
    introducing plasma phase nitrogen containing agent.

7. The method of claim 1, wherein the nitrogen containing agent comprising $NF_3$ and $NH_3$.

8. The method of claim 1, wherein the nitrogen containing agent comprises HF and $NH_3$.

9. The method of claim 1, wherein treating the first gate oxide layer with the nitrogen containing agent is performed on the first gate oxide layer in a low voltage region but not on the first gate oxide layer in a high voltage region.

10. The method of claim 1, wherein the high-k dielectric layer is formed in a high voltage region.

11. The method of claim 1, further comprising, after treating the first gate oxide layer in a low voltage region, removing a mask layer that covers the first gate oxide layer in a high voltage region.

12. The method of claim 1, wherein forming the first gate oxide layer on the first channel region is performed such that the first gate oxide layer has a first thickness, and forming the high-k dielectric layer directly over the surface of the interfacial layer is performed such that the interfacial layer below the high-k dielectric layer has a second thickness less than the first thickness of the first gate oxide layer.

13. A method of fabricating a semiconductor device, the method comprising:
   forming first and second semiconductor fins, wherein the first semiconductor fin comprises a first channel for a first fin field effect transistor (finFET), and the second semiconductor fin comprises a second channel for a second finFET;
   forming a gate oxide layer on the first channel and second channel, wherein the gate oxide layer has a first portion on the first channel and a second portion on the second channel;
   depositing a mask layer covering a top surface of the gate oxide layer;
   removing a first portion of the mask layer from the first portion of the gate oxide layer, wherein a second portion of the mask layer remains covering a top surface of the second portion of the gate oxide layer after removing the first portion of the mask layer from the first portion of the gate oxide layer;
   after removing the first portion of the mask layer from the first portion of the gate oxide layer, treating the first portion of the gate oxide layer with a nitrogen containing agent so as to form a water soluble layer and an interfacial layer on the first channel;
   removing the water soluble layer;
   removing the second portion of the mask layer from the second portion of the gate oxide layer;
   forming a high-k dielectric layer on the interfacial layer and on the second portion of the gate oxide layer, wherein the interfacial layer has a thickness thinner than the second portion of the gate oxide layer; and
   forming a metal gate on the high-k dielectric layer.

14. The method of claim 13, wherein the water soluble layer comprises ammonium hexafluorosilicate (AHFS).

15. The method of claim 13, wherein the removing the water soluble layer comprises:
   rinsing the first semiconductor fin with deionized water.

16. A method of fabricating a semiconductor device, the method comprising:
   forming first and second semiconductor fins on a substrate;
   forming first and second gate oxide layers on the first and second semiconductor fins, respectively;
   forming a mask layer on the second gate oxide layer, wherein the first gate oxide layer is exposed from the mask layer;
   performing a chemical treatment to the exposed first gate oxide layer on the first semiconductor fin while the second gate oxide layer on the second semiconductor fin is covered by the mask layer, such that bottom and top portions of the first gate oxide layer are respectively converted into a $Si^{4+}$ containing layer and an ammonium hexafluorosilicate (AHFS) layer;
   removing the AHFS layer from the $Si^{4+}$ containing layer, wherein the $Si^{4+}$ containing layer remains on the first semiconductor fin after removing the AHFS layer from the $Si^{4+}$ containing layer;
   removing the mask layer from the second gate oxide layer;
   forming a high-k dielectric layer on the $Si^{4+}$ containing layer and the second gate oxide layer; and
   forming a metal gate on the high-k dielectric layer.

17. The method of claim 16, wherein removing the AHFS layer is performed using deionized water, and the AHFS layer has higher solubility in the deionized water than that of the $Si^{4+}$ containing layer.

18. The method of claim 16, wherein performing the chemical treatment comprises treating the exposed first gate oxide layer using a nitrogen containing agent.

19. The method of claim 16, wherein the chemical treatment is performed such that the $Si^{4+}$ containing layer is thinner than the second gate oxide layer.

20. The method of claim 16, wherein forming the high-k dielectric layer on the $Si^{4+}$ containing layer is performed after removing the AHFS layer such that the high-k dielectric layer is on the remained $Si^{4+}$ containing layer on the first semiconductor fin and the second gate oxide layer on the second semiconductor fin.

* * * * *